United States Patent [19]
Matsubara et al.

[11] Patent Number: 6,037,625
[45] Date of Patent: Mar. 14, 2000

[54] SEMICONDUCTOR DEVICE WITH SALICIDE STRUCTURE AND FABRICATION METHOD THEREOF

[75] Inventors: Yoshihisa Matsubara; Masato Kawata, both of Tokyo, Japan

[73] Assignee: NEC Corporation, Tokyo, Japan

[21] Appl. No.: 09/206,377

[22] Filed: Dec. 7, 1998

[30] Foreign Application Priority Data

Dec. 8, 1997 [JP] Japan ..................... 9-336774

[51] Int. Cl.[7] ..................... H01L 21/8239; H01L 27/105
[52] U.S. Cl. .................... 257/315; 257/382; 257/384; 438/201; 438/211; 438/275; 438/655; 438/682; 438/257
[58] Field of Search .................... 257/315, 382, 257/383, 384, 390; 438/200, 201, 211, 230, 231, 233, 257, 258, 265, 275, 598, 649, 655, 682, 683, 660, FOR 360, FOR 359, FOR 189, FOR 196, FOR 211, FOR 212, FOR 216, FOR 217, FOR 218, FOR 219

[56] References Cited

U.S. PATENT DOCUMENTS

| | | | |
|---|---|---|---|
| 4,471,373 | 9/1984 | Shimizu et al. | 257/315 |
| 4,717,684 | 1/1988 | Katto et al. | |
| 4,811,076 | 3/1989 | Tigelaar et al. | |
| 4,918,501 | 4/1990 | Komori et al. | 257/315 |
| 5,262,344 | 11/1993 | Mistry. | |
| 5,585,299 | 12/1996 | Hsu. | |
| 5,672,527 | 9/1997 | Lee. | |
| 5,904,518 | 5/1999 | Komori et al. | 438/201 |
| 5,907,171 | 5/1999 | Santin et al. | 257/315 |
| 5,946,573 | 8/1999 | Hsu | 438/275 |

FOREIGN PATENT DOCUMENTS 5-190811 7/1993 Japan.

OTHER PUBLICATIONS

Y. Tang et al., "Different Dependence of Band–to–Band and Fowler–Nordheim Tunnelling on Source Doping Concentration of an n–MOSFET", pp. 525–527, IEEE Electron Device Letters, vol. 17, No. 11, Nov. 1996.

H.K. Park et al., "Effects of Ion Implantation Doping on the Formation of $TiSi_2$,", *Journal of vacuum Science and Technology*, vol. 2, No. 2, 1984, pp. 264–268.

*Primary Examiner*—Mary Wilczewski
*Attorney, Agent, or Firm*—Young & Thompson

[57] ABSTRACT

A semiconductor device is provided, which makes it possible to decrease the electric sheet resistance of source/drain regions of MOSFETs in a peripheral circuitry without degradation of the data writing speed in nonvolatile memory cells. This device is comprised of nonvolatile memory cells and a peripheral circuitry provided on a same semiconductor substrate. The nonvolatile memory cells are formed by a first plurality of MOSFETs of a first conductivity type. The peripheral circuitry includes a second plurality of MOSFETs of the first conductivity type. Each of the first plurality of MOSFETs is equipped with a gate electrode having a floating gate for data storing and source/drain regions having substantially no silicide films. Each of the second plurality of MOSFETs is equipped with source/drain regions having silicide films and a doping concentration lower than that of the source/drain regions of each of the first plurality of MOSFETs. It is preferred that the doping concentration of the source/drain regions of the first plurality of MOSFETs is equal to $1 \times 10^{19}$ atoms/$cm^3$ or higher and the doping concentration of the source/drain regions of the second plurality of MOSFETs is lower than $1 \times 10^{19}$ atoms/$cm^3$.

6 Claims, 16 Drawing Sheets

SEMICONDUCTOR DEVICE WITH SALICIDE STRUCTURE AND FABRICATION METHOD THEREOF

BACKGROUND OF THE INVENTION

1. Field of the Invention

The present invention relates to a semiconductor device with a self-aligned silicide (SALICIDE) structure and a fabrication method thereof and more particularly, to a semiconductor device equipped with nonvolatile memory cells formed by Metal-Oxide-Semiconductor Field-Effect Transistors (MOSFETs) and a peripheral circuitry including MOSFETs on a semiconductor substrate, in which the MOSFETs of the peripheral circuitry have silicide layers at their source/drain regions while the MOSFETs of the memory cells have no silicide layers at their source/drain regions, and a fabrication method of the semiconductor device.

2. Description of the Prior Art

Conventionally, the miniaturization and integration of semiconductor elements and components have been progressing perpetually in semiconductor integrated circuit devices.

In recent years, highly-integrated semiconductor integrated circuit devices (i.e., LSIs) designed according to the design rule as small as 0.15 to 0.25 $\mu$m, such as memory devices and logic devices, have been fabricated and actually used. These LSIs are often constituted by the use of MOSFETs, because MOSFETs are miniaturized more readily than bipolar transistors.

According to the progressing integration of the semiconductor elements and components in the LSIs, there has been the need to decrease the length of the gate electrodes and the width of the source/drain regions in the MOSFETs. However, the decrease in the length of the gate electrodes and the width of the source/drain regions increases their electric resistance and as a result, there arises a problem that the operation speed of the inner circuits of the LSIs tends to be badly affected.

To solve this problem, refractory silicide layers, which are low in electric resistance, have been widely used for the source/drain regions formed in a single-crystal silicon (Si) substrate and the gate electrodes made of polycrystalline Si (i.e., polysilicon) in the miniaturized MOSFETs. The refractory silicide layers are typically located on the surface areas of the source/drain regions and the gate electrodes.

The silicide layers are typically formed by the use of the well-known SALICIDE technique. Specifically, first, a refractory metal such as a titanium (Ti) film is formed in contact with the single-crystal Si source/drain regions and the polysilicon gate electrodes. Then, the refractory metal film, the source/drain regions, and the gate electrodes are heat-treated to cause a silicidation reaction between the refractory metal and Si. Thus, refractory silicide films are formed at the surface areas of the source/drain regions, and the gate electrodes, respectively. Finally, the unreacted refractory metal film is removed. Since the refractory silicide films are formed in self-alignment to the gate electrodes and an isolation dielectric without any masking film, this formation method is termed the "self-aligned silicide" technique, or the "SALICIDE" technique. Also, the source/drain regions and the gate electrodes equipped with the silicide films thus formed are termed the "SALICIDE" structure.

FIGS. 1A to 1K show a conventional fabrication method of a flush nonvolatile semiconductor memory device which is termed a flush Electrically Erasable Programmable Read-Only Memory (EEPROM), in which the SALICIDE technique is used.

This memory device is comprised of a lot of nonvolatile memory cells formed by n-channel MOSFETs with floating gates and a peripheral circuitry formed by n- and p-channel MOSFETs. Therefore, the peripheral circuitry has the Complementary MOS (CMOS) structure. The peripheral circuitry serves to provide control operations for the memory cells, such as the reading operation and the writing or reprogramming operation. The memory cells are arranged in a matrix array in a memory cell area. The n- and p-channel MOSFETs of the peripheral circuitry are arranged in peripheral NMOS and PMOS areas, respectively.

In FIGS. 1A to 1K, however, two adjoining ones of the n-channel MOSFETs in the memory cells, one of the n-channel MOSFETs in the peripheral circuitry, and one of the p-channel MOSFETs in the peripheral circuitry are explained below for the sake of simplification of description.

First, as shown in FIG. 1A, an isolation dielectric 102 with a specific depth is selectively formed at the main surface of a p- or n-type single-crystal Si substrate 101 by the well-known Local Oxidation of Silicon (LOCOS) process, thereby defining a peripheral NMOS area 151 and a peripheral PMOS area 152 of the peripheral circuitry and a memory cell area 153.

Next, a patterned photoresist film 103a with a window uncovering the peripheral NMOS area 151 is formed using a photolithography technique. Then, using the photoresist film 103a as a mask, boron (B) is selectively ion-implanted into the substrate 101, thereby forming a p-type well 104 in the peripheral NMOS area 151, as shown in FIG. 1B. Thereafter, the photoresist film 103a is removed.

In the same way as that of the p-type well 104, an n-type well 105 is formed in the peripheral PMOS area 152 and a p-type well 106 is formed in the memory cell area 153, as shown in FIG. 1C.

A silicon dioxide ($SiO_2$) film 137 is formed on the whole main surface of the substrate 101 by a thermal oxidation process, as shown in FIG. 1D. By successive Chemical Vapor Deposition (CVD) processes, a polysilicon film 138 (approximately 150 nm in thickness) is formed on the whole $SiO_2$ film 137, an ONO film 139 is formed on the whole polysilicon film 138, and a tungsten polycide film 140 is formed on the whole ONO film 139. The ONO film 139 is formed by three stacked subfilms, i.e., a $SiO_2$ subfilm, a silicon nitride ($Si_3N_4$) sub film, and a $SiO_2$ subfilm. The tungsten polycide film 140 is a composite film of an impurity-doped polysilicon subfilm and a tungsten silicide subfilm, where the impurity is typically phosphorus (P).

Thereafter, a patterned photoresist film 103b with a pattern covering the areas for gate electrodes is formed using a photolithography technique. Then, using the photoresist film 103b as a mask, the polysilicon film 138, the ONO film 139, and the tungsten polycide film 140 are successively patterned, thereby forming gate electrodes 111 for the n-channel MOSFETs arranged in the memory cell area 153, as shown in FIG. 1E. The gate electrodes 111 are formed by the combination of the remaining polysilicon film 138, the remaining ONO film 139, and the remaining tungsten polycide film 140. In this patterning process, the $SiO_2$ film 137 is not patterned.

A polysilicon film (not shown) is formed on the whole $SiO_2$ film 137 to cover the whole substrate 101 and then, the polysilicon film is patterned to form gate electrodes 112 for the n- and p-channel MOSFETs in the peripheral NMOS and PMOS regions 151 and 152. In this patterning process, the SiO$_2$ film 137 is not patterned.

The SiO$_2$ film 137 is selectively etched using the gate electrodes 111 and 112 as a mask, thereby forming respective gate oxide films 107 and 108. The state at this stage is shown in FIG. 1E.

Following this step, a SiO$_2$ film (not shown) is formed on the uncovered main surface of the substrate 101 to cover the gate electrodes 111 and 112 by a CVD process. The SiO$_2$ film is then etched back by an anisotropic etching process, thereby forming sidewall spacers 113 at each side of the gate electrodes 111 and 112, as shown in FIG. 1F.

An n-type impurity such as arsenic (As) is selectively ion-implanted into the p-type wells 104 and 106 while covering the peripheral PMOS area 152 by a mask. Thus, the n-type impurity is selectively implanted into the p-type wells 104 and 106 in self-alignment to the gate electrodes 111 and 112, the sidewall spacers 113, and the isolation dielectric 102.

In the same way as the p-type wells 104 and 106, a p-type impurity such as boron (B) is selectively ion-implanted into the n-type well 105 while covering the peripheral NMOS area 151 and the memory cell area 153 by a mask. Thus, the p-type impurity is selectively implanted into the n-type well 105 in self-alignment to the gate electrodes 111 and 112, the sidewall spacers 113, and the isolation dielectric 102.

After an annealing process at a temperature of 800 to 1000° C., n-type source/drain regions 114 are formed in the p-type well 104, p-type source/drain regions 115 are formed in the n-type well 105, and n-type source/drain regions 114 are formed in the p-type well 106. The state at this stage is shown in FIG. 1F.

Subsequently, as shown in FIG. 1G, a titanium (Ti) film 116 with a thickness of approximately 50 nm is formed over the whole surface of the substrate 101. The substrate 101 with the Ti film 116 is subjected to a heat treatment in a nitrogen (N$_2$) atmosphere with a normal pressure at a temperature of 600 to 650° C. for 30 to 60 seconds using a heat treatment apparatus such as a lamp annealing apparatus.

Thus, nitrogen atoms are diffused into the Ti film 116 to thereby form a nitrogen-containing Ti film 119, as shown in FIG. 1H. At the same time as this, the single-crystal Si source/drain regions 114 and 115 and the gate electrodes 112 chemically react with the nitrogen-containing Ti film 119, resulting in titanium silicide (TiSi$_2$) films 117a and 117b due to a silicidation reaction. The TiSi$_2$ films 117a are located at the surfaces of the source/drain regions 114 and 115. The TiSi$_2$ films 117b are located at the surfaces of the gate electrodes 112.

The TiSi$_2$ films 117a and 117b, which has the C49 phase, has a comparatively high electric resistance of approximately 60 $\mu\Omega$·cm.

After this heat treatment process for silicidation, the unreacted nitrogen-containing Ti film 119 is removed by a wet etching process using a mixture of water solutions of ammuonia (NH$_3$) and hydrogen peroxide (H$_2$O$_2$). Thus, the TiS$_2$ i films 117a and to 117b are selectively left on the substrate 101, as shown in FIG. 1I.

The substrate 101 with the TiSi$_2$ films 117a and 117b is then subjected to another heat treatment in a nitrogen (N$_2$) atmosphere with a normal pressure at a temperature of approximately 850° C. for approximately 60 seconds using a heat treatment apparatus such as a lamp annealing apparatus. Thus, the TiSi$_2$ films 117a and 117b having the C49 phase are turned to have the C54 phase due to phase transition.

The TiSi$_2$ films 117a and 117b having the C54 phase has a comparatively low electric resistance of approximately 20 $\mu\Omega$·cm.

A thick SiO$_2$ film 120 serving as an interlevel dielectric is formed to cover the whole surface of the substrate 101 by a CVD process. Then, the surface of the SiO$_2$ film 120 is planarized by a Chemical Mechanical Polishing (CMP) process, as shown in FIG. 1J.

Then, as shown in FIG. 1K, via holes 123 are formed to penetrate through the SiO$_2$ film 120 by using photolithography and etching techniques to the source/drain regions 114 and 115 and the gate electrodes 111 and 112. Metallic plugs 121 are filled in the via holes 123 to be contacted with the source/drain regions 114 and 115 and the gate electrodes 111 and 112 by a selective growth process of a metal film.

Finally, an aluminum (Al) film (not shown) is formed on the SiO$_2$ film 120 and then, it is patterned to form wiring lines 122 to be contacted with the metallic plugs 121. Thus, the source/drain regions 114 and 115 and the gate electrodes 111 and 112 are electrically connected to the wiring lines 122.

Through the above-described process steps, the conventional flush nonvolatile semiconductor memory device is completed.

As seen from FIG. 1K, the n-type source/drain regions 114 having the silicide films 117a, the gate oxide film 107, the gate electrode 112 having the silicide films 117b, and the sidewall spacers 113 located in the peripheral NMOS area 151 constitute an n-channel MOSFET 161 of the peripheral circuitry. The p-type source/drain regions 115 having the silicide films 117a, the gate oxide film 107, the gate electrode 112 having the silicide films 117b, and the sidewall spacers 113 located in the peripheral PMOS area 152 constitute a p-channel MOSFET 162 of the peripheral circuitry. The n-type source/drain regions 114 having the silicide films 117a, the gate oxide film 107, the gate electrode 111, and the sidewall spacers 113 located in the memory cell area 153 constitute n-channel MOSFETs 163 of the memory cell array.

With the conventional fabrication method of the flush nonvolatile semiconductor memory device shown in FIGS. 1A to 1K, to improve the performance of the memory device while thinning the refractory silicide films 117a and 117b of the MOSFETs in the peripheral NMOS and PMOS areas 151 and 152, there is the following problem.

Specifically, when electrons are drawn out from the floating gates 108 to the source/drain regions 114 of the MOSFETs 163 in the memory cell area 153, the drawing speed of the electrons need to be as high as possible. From this point of view, it is preferred that the doping concentration of the source/drain regions 114 is set as high as possible. In this case, however, there is a problem that refractory silicide tends to be difficult to be produced if arsenic (As) is used as the n-type impurity for the source/drain regions 114. This is because the silicidation reaction is suppressed by the arsenic impurity doped into the regions 114 and as a consequence, the nitriding reaction becomes superior to the silicidation reaction.

There are two solutions to solve this problem. A first one of the solutions is to decrease the doping (i.e., As) concentration of the source/drain regions 114. A second one of the solutions is to increase the thickness of the Ti film 116, thereby suppressing the competition or conflict between the nitriding and silicidation reactions.

With the first one of the solutions, however, as disclosed in an article written by Y. Tang et al., IEEE ELECTRON DEVICE LETTERS, Vol. 17, No. 11, pp 525–527, November 1996, the Fowler-Nordheim tunneling current becomes small. This lowers the drawing speed of the electrons from the floating gates 108, thereby delaying the operation speed of the memory device.

With the second one of the solutions, the $TiSi_2$ films 117a and 117b become thicker according to the thickness increase of the Ti film 116. Therefore, the shallow p-n junctions of the source/drain regions 114 and 115 occurring due to the device miniaturization tendency approach the $TiSi_2$ films 117a and 117b, resulting in increase of the current leakage. This means that the thickness increase of the Ti film 116 is contrary to the requirement to decrease the thickness of the $TiSi_2$, films 117a and 117b. Accordingly, the second one of the solutions is unable to be adopted for this purpose.

SUMMARY OF THE INVENTION

Accordingly, an object of the present invention to provide a semiconductor device that makes it possible to decrease the electric sheet resistance of source/drain regions of MOSFETs in a peripheral circuitry without degradation of the data writing speed in nonvolatile memory cells, and a fabrication method of the device.

Another object of the present invention is to provide a semiconductor device that copes with both of miniaturization and performance improvement, and a fabrication method of the device.

The above objects together with others not specifically mentioned will become clear to those skilled in the art from the following description.

According to a first aspect of the present invention, a semiconductor device is provided, which is comprised of nonvolatile memory cells and a peripheral circuitry provided on a same semiconductor substrate.

The nonvolatile memory cells are formed by a first plurality of MOSFETs of a first conductivity type. The peripheral circuitry includes a second plurality of MOSFETs of the first conductivity type.

Each of the first plurality of MOSFETs is equipped with a gate electrode having a floating gate for data storing and source/drain regions having substantially no silicide films.

Each of the second plurality of MOSFETs is equipped with source/drain regions having silicide films and a doping concentration lower than that of the source/drain regions of each of the first plurality of MOSFETs.

With the semiconductor device according to the first aspect of the present invention, each of the second plurality of MOSFETs of the first conductivity type in the peripheral circuitry have the source/drain regions whose doping concentration is lower than that of the source/drain regions of the first plurality of MOSFETs in the nonvolatile memory cells. Therefore, to raise the drawing speed of the electrons from the floating gates to the source/drain regions of the first plurality of MOSFETs in the nonvolatile memory cells (i.e., the access speed to the memory cells), the doping concentration of the source/drain regions of the first plurality of MOSFETs can be increased as necessary.

On the other hand, since the doping concentration of the source/drain regions of the second plurality of MOSFETs in the peripheral circuitry is lower than that of the source/drain regions of the first plurality of MOSFETs in the memory cells, the electric sheet resistance of the source/drain regions of the second plurality of MOSFETs is higher than that of the source/drain regions of the first plurality of MOSFETs.

However, the source/drain regions of the second plurality of MOSFETs in the peripheral circuitry have the silicide films while the source/drain regions of the first plurality of MOSFETs in the memory cells have substantially no silicide films. Therefore, the sheet resistance of the source/drain regions of the second plurality of MOSFETs is readily equalized to that of the first plurality of MOSFETs.

Accordingly, the electric sheet resistance of source/drain regions of the second plurality of MOSFETs in the peripheral circuitry is able to be decreased to the desired low electric sheet resistance of source/drain regions of the first plurality of MOSFETs in the memory cells without degradation of the data writing speed in the memory cells.

This means that both of miniaturization and performance improvement of a semiconductor device of this sort is able to be realized.

In a preferred embodiment of the device according to the first aspect of the present invention, each of the second plurality of MOSFETs in the peripheral circuitry has a SALICIDE structure.

In another preferred embodiment of the device according to the first aspect of the present invention, the doping concentration of the source/drain regions of the first plurality of MOSFETs in the memory cells is equal to $1 \times 10^{19}$ atoms/cm$^3$ or higher and the doping concentration of the source/drain regions of the second plurality of MOSFETs in the peripheral circuitry is lower than $1 \times 10^{19}$ atoms/cm$^3$.

In still another preferred embodiment of the device according to the first aspect of the present invention, the peripheral circuitry includes a third plurality of MOSFETs of a second conductivity type opposite to the first conductivity type, thereby forming a CMOS structure. Each of the third plurality of MOSFETs is equipped with source/drain regions having silicide films and a doping concentration lower than that of the source/drain regions of each of the first plurality of MOSFETs.

In this embodiment, it is preferred that each of the third plurality of MOSFETs in the peripheral circuitry has a SALICIDE structure. Also, it is preferred that the doping concentration of the source/drain regions of the third plurality of MOSFETs is lower than $1 \times 10^{19}$ atoms/cm$^3$.

According to a second aspect of the present invention, a fabrication method of a semiconductor device is provided, which is comprised of the following steps (a) to (g).

In the step (a), a memory cell area in which nonvolatile memory cells are provided and a peripheral circuitry in which a peripheral circuitry is provided are defined on a single-crystal Si substrate.

In the step (b), gate electrodes of a first plurality of MOSFETs for the nonvolatile memory cells are formed through gate insulating films in the memory cell area and gate electrodes of a second plurality of MOSFETs for the peripheral circuitry are formed through gate insulating films in the peripheral circuitry area.

The gate electrodes of the first plurality of MOSFETs is equipped with floating gates for data storing.

In the step (c), dielectric sidewall spacers are formed on the substrate at each side of the gate electrodes of the first plurality of MOSFETs in the memory cell area and the gate electrodes of the second plurality of MOSFETs in the peripheral circuitry area.

In the step (d), a first impurity is selectively ionimplanted into the substrate to form source/drain regions of the first plurality of MOSFETs in the memory cell area and source/drain regions of the second plurality of MOSFETs in the peripheral circuitry area using the sidewall spacers and the gate electrodes of the first and second pluralities of MOSFETs as a mask.

The source/drain regions of the second plurality of MOSFETs are lower in doping concentration than the source/drain regions of the first plurality of MOSFETs.

In the step (e), a first refractory metal film is formed to cover the first and second pluralities of MOSFETs.

In the step (f), a silicide film is formed on the source/drain regions of the second plurality of MOSFETs by a silicidation reaction of the first refractory metal film with the source/drain regions of the second plurality of MOSFETs.

Substantially no silicide film is formed on the source/drain regions of the first plurality of MOSFETs in the step (f).

In the step (g), the unreacted refractory metal film is removed.

With the fabrication method of a semiconductor device according to the second aspect of the present invention, as clearly seen, the semiconductor device according to the first aspect of the present invention is fabricated.

In a preferred embodiment of the method according to the second aspect of the present invention, each of the second plurality of MOSFETs in the peripheral circuitry has a SALICIDE structure.

In another preferred embodiment of the method according to the second aspect of the present invention, the doping concentration of the source/drain regions of the first plurality of MOSFETs in the memory cell area is equal to $1 \times 10^{19}$ atoms/cm$^3$ or higher and the doping concentration of the source/drain regions of the second plurality of MOSFETs in the peripheral circuitry area is lower than $1 \times 10^{19}$ atoms/cm$^3$.

In still another preferred embodiment of the method according to the second aspect of the present invention, the peripheral circuitry area includes a third plurality of MOSFETs of a second conductivity type opposite to the first conductivity type, thereby forming a CMOS structure. Each of the third plurality of MOSFETs is equipped with source/drain regions having silicide films and a doping concentration lower than that of the source/drain regions of each of the first plurality of MOSFETs.

In this embodiment, it is preferred that each of the third plurality of MOSFETs in the peripheral circuitry has a SALICIDE structure. Also, it is preferred that the doping concentration of the source/drain regions of the third plurality of MOSFETs is lower than $1 \times 10^{19}$ atoms/cm$^3$.

In a further preferred embodiment of the method according to the second aspect of the present invention, the first impurity is ion-implanted into the memory cell area with a dose of $5 \times 10^{15}$ atoms/cm$^2$ or higher and into the peripheral circuitry area with a dose of $3 \times 10^{15}$ atoms/cm$^2$ or lower in the step (d).

In a still further preferred embodiment of the method according to the second aspect of the present invention, the first refractory metal film formed in the step (e) has a thickness of 30 nm or less.

In a still further preferred embodiment of the method according to the second aspect of the present invention, a second refractory metal film is formed on the first refractory metal film in the step (e).

In this embodiment, it is preferred that the second refractory metal film has approximately a same thickness as that of the first refractory metal film.

In a still further preferred embodiment of the method according to the second aspect of the present invention, the gate electrodes of the second plurality of MOSFETs in the peripheral circuitry area have silicide films at their tops.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
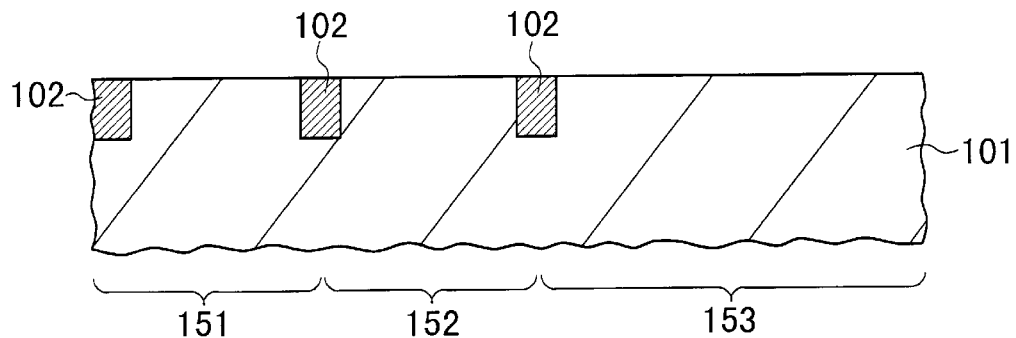
FIGS. 1A to 1K are partial cross-sectional views showing a conventional fabrication method of a flush nonvolatile semiconductor memory device, respectively.
Figure 1B:
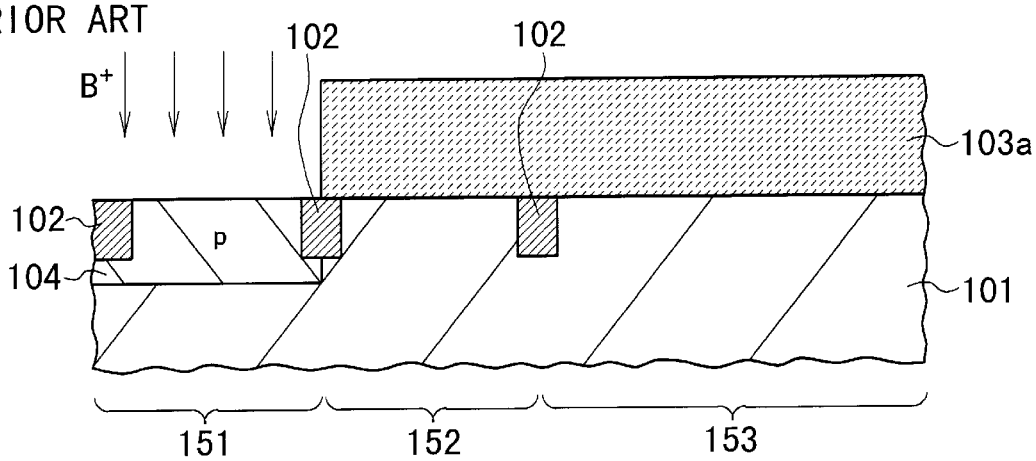
Figure 1C:
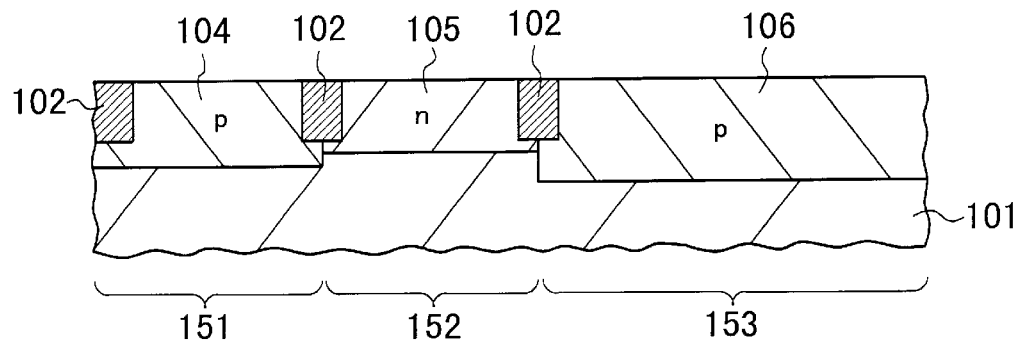
Figure 1D:
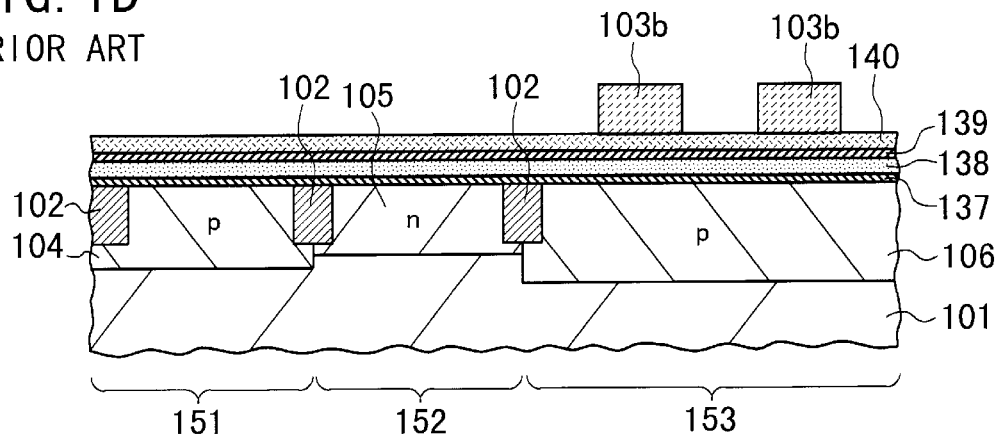
Figure 1E:
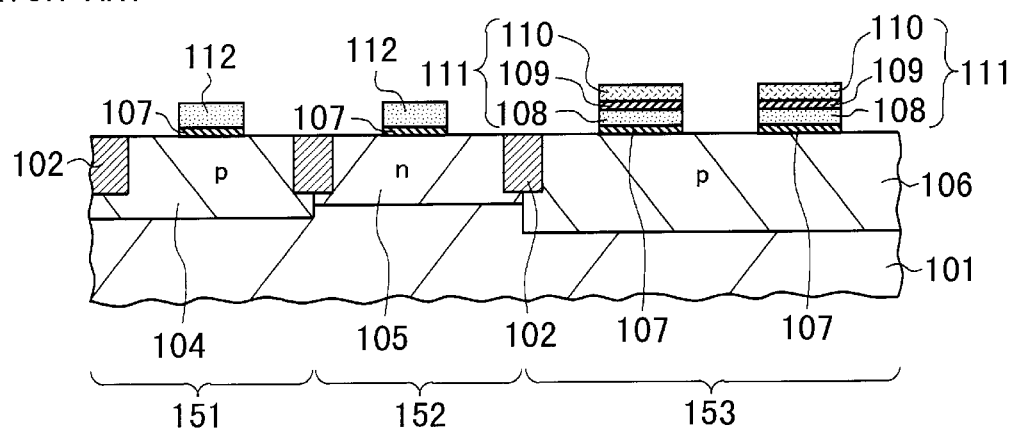
Figure 1F:
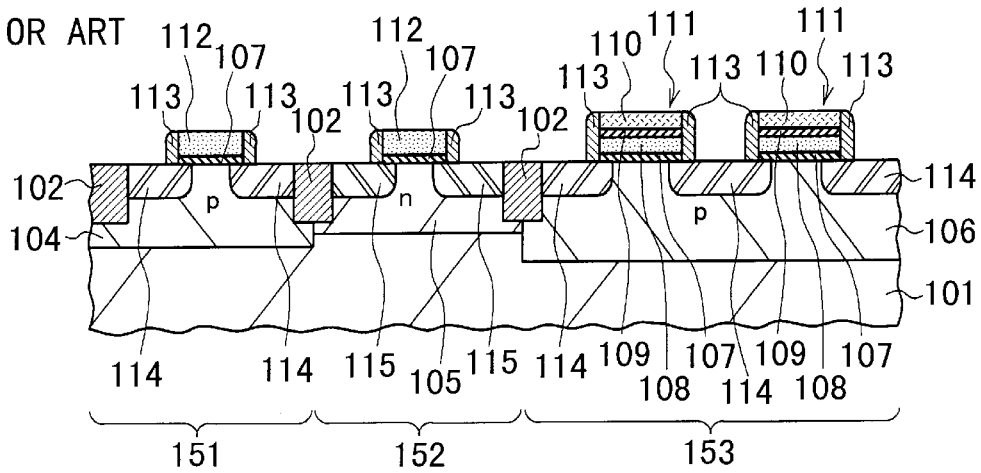
Figure 1G:
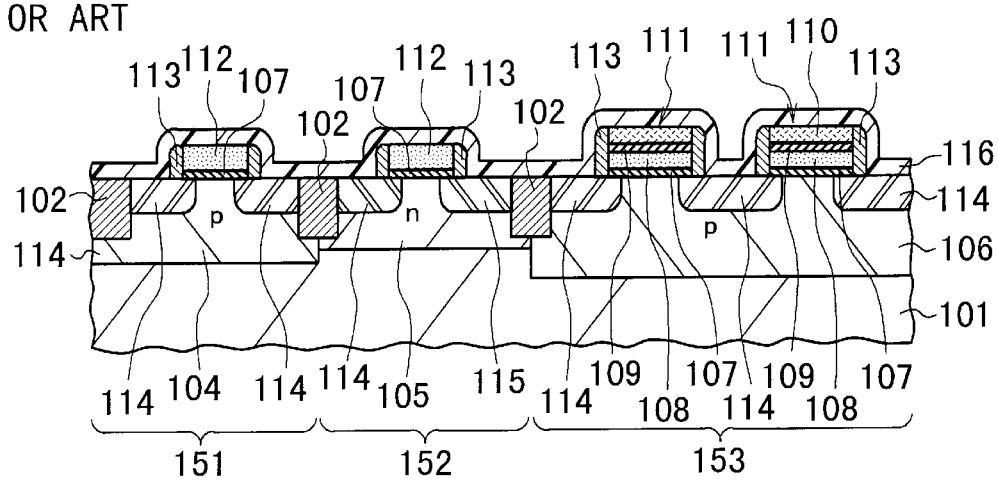
Figure 1H:
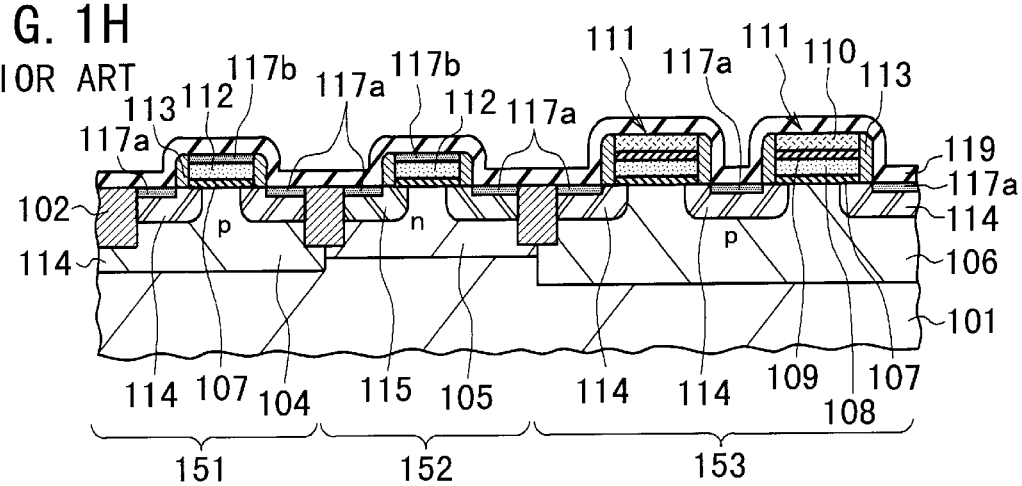
Figure 1I:
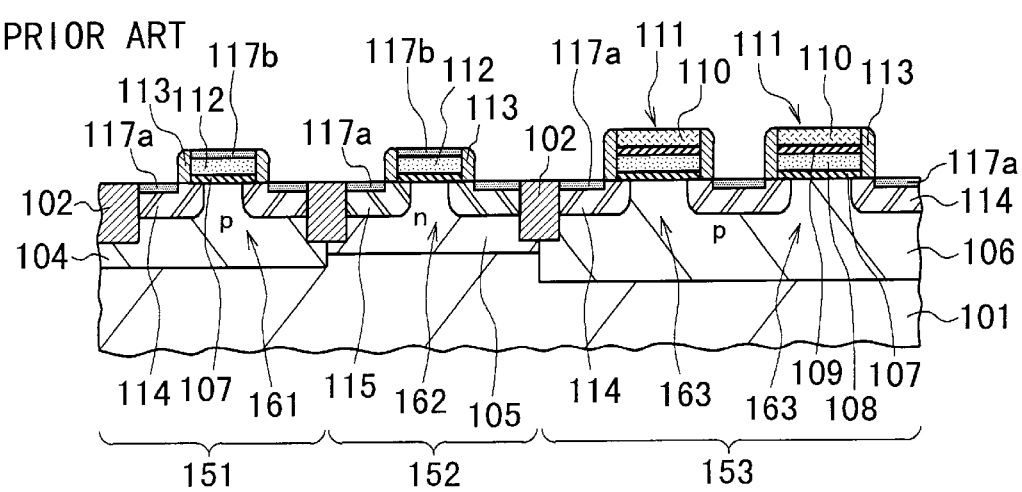
Figure 1J:
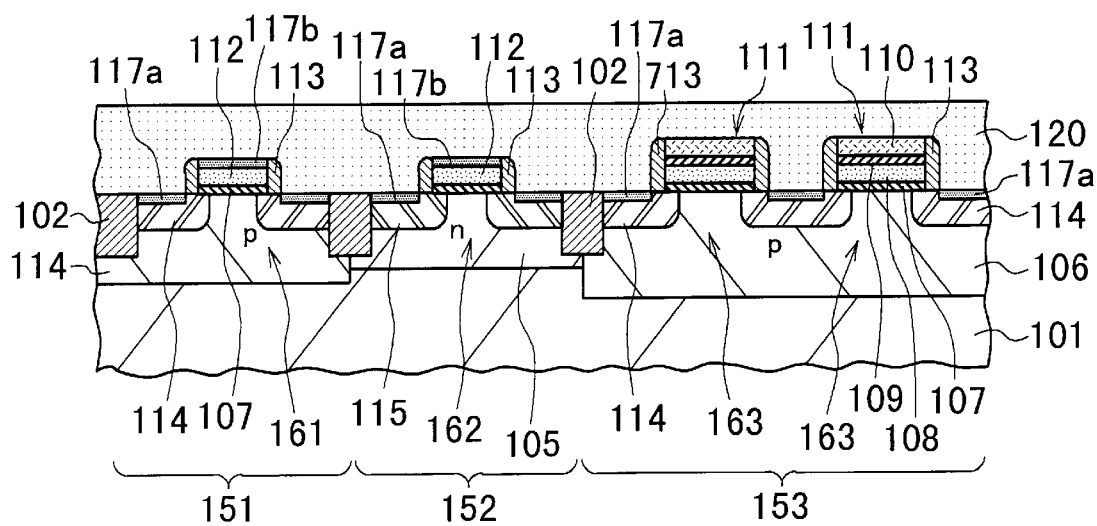
Figure 1K:
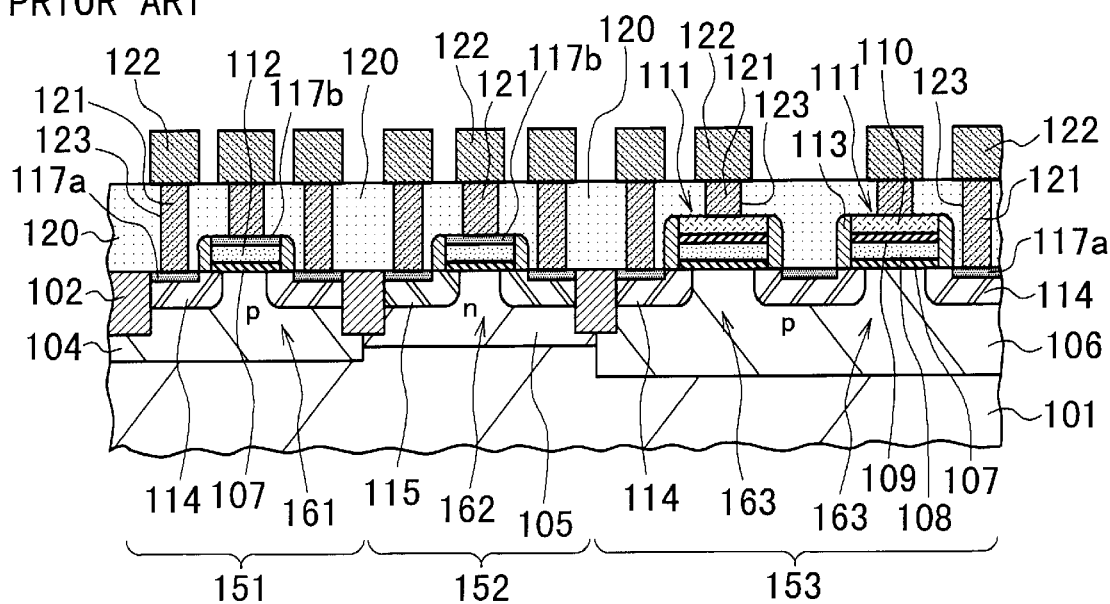

Preferred embodiments of the present invention will be described in detail below while referring to the drawings attached.

FIRST EMBODIMENT

A flush nonvolatile semiconductor memory device, which is termed a flush EEPROM, according to a first embodiment of the present invention is fabricated in the following way, in which explanation is performed with reference to FIGS. 2A to 2K.

Like the conventional semiconductor memory device shown in FIGS. 1A to 1K, this memory device is comprised of a lot of nonvolatile memory cells formed by n-channel MOSFETs with floating gates and a peripheral circuitry formed by n- and p-channel MOSFETs with the CMOS structure. The peripheral circuitry serves to provide control operations for the memory cells, such as the reading operation and the writing or reprogramming operation. The memory cells are arranged in a matrix array in a memory cell area. The n- and p-channel MOSFETs of the peripheral circuitry are arranged in peripheral NMOS and PMOS areas, respectively.

In FIGS. 2A to 2K, however, two adjoining ones of the n-channel MOSFETs in the memory cells, one of the n-channel MOSFETs in the peripheral circuitry, and one of the p-channel MOSFETs in the peripheral circuitry are explained below for the sake of simplification of description.

Figure 2A:
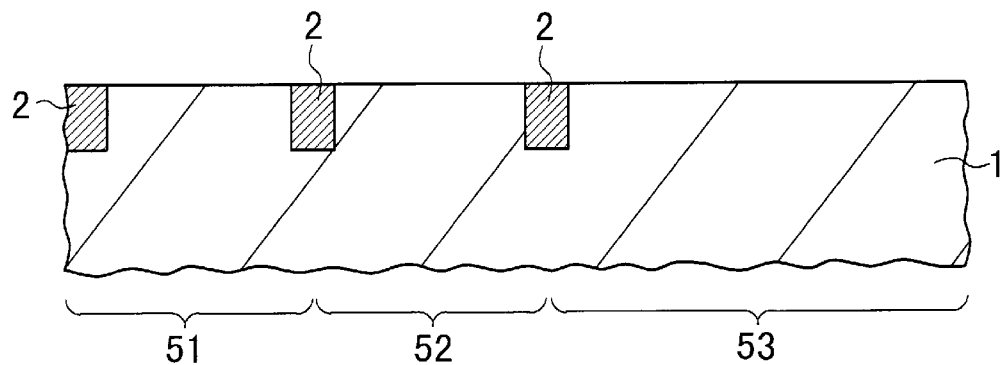
FIGS. 2A to 2K are partial cross-sectional views showing a fabrication method of a flush nonvolatile semiconductor memory device according to a first embodiment of the present invention, respectively.

First, as shown in FIG. 2A, an isolation dielectric 2 with a specific depth is selectively formed at the main surface of a p- or n-type single-crystal Si substrate 1 by the well-known LOCOS process, thereby defining a peripheral NMOS area 51 and a peripheral PMOS area 52 of the peripheral circuitry and a memory cell area 53.

Figure 2B:
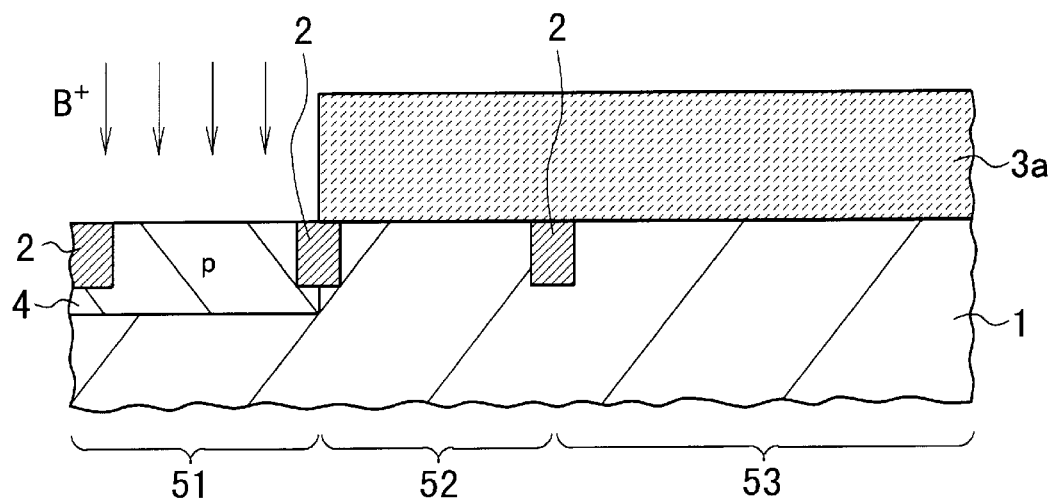

Next, a patterned photoresist film 3a with a window uncovering the peripheral NMOS area 51 is formed using a photolithography technique. Then, using the photoresist film 3a as a mask, boron (B) is selectively ion-implanted into the substrate 101, thereby forming a p-type well 4 in the peripheral NMOS area 51, as shown in FIG. 2B. Thereafter, the photoresist film 3a is removed.

Figure 2C:
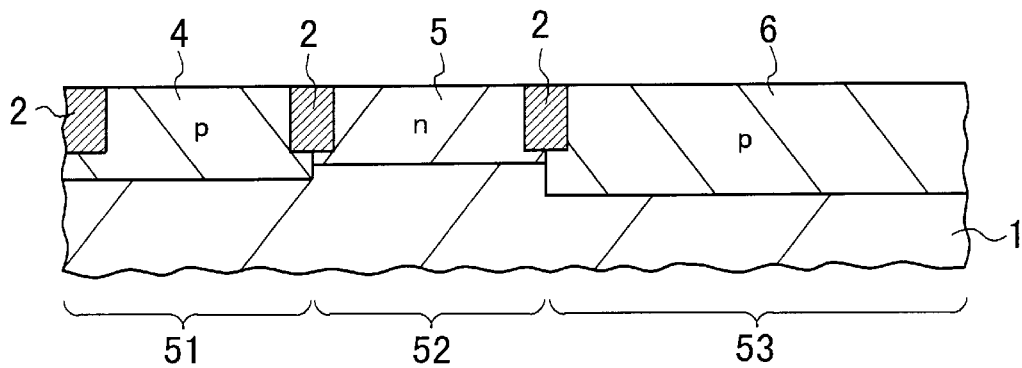

In the same way as that of the p-type well 4, an n-type well 5 is formed in the peripheral PMOS area 52 and a p-type well 6 is formed in the memory cell area 53, as shown in FIG. 2C.

Figure 2D:
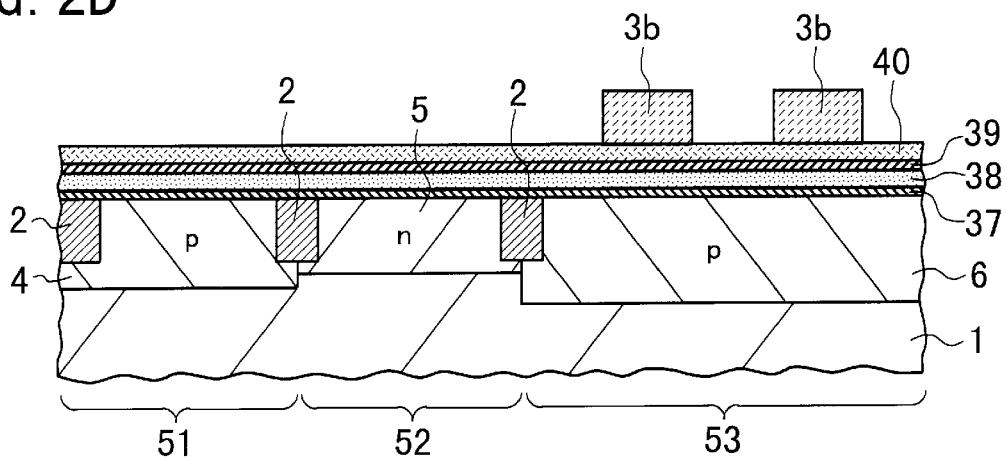

A $SiO_2$ film 37 is formed on the whole main surface of the substrate 1 by a thermal oxidation process, as shown in FIG. 2D. By successive CVD processes, a polysilicon film 38 (approximately 150 nm in thickness) is formed on the whole $SiO_2$ film 37, an ONO film 39 is form red on the whole polysilicon film 38, and a tungsten polycide film 40 is formed on the whole ONO film 39. The ONO film 39 is formed by three stacked subfilms, i.e., a $SiO_2$ subfilm, a $Si_3N_4$ subfilm, and a $SiO_2$ subfilm. The tungsten polycide film 40 is a composite film of an impurity-doped polysilicon subfilm and a tungsten silicide subfilm, where the impurity is typically phosphorus (P).

Figure 2E:
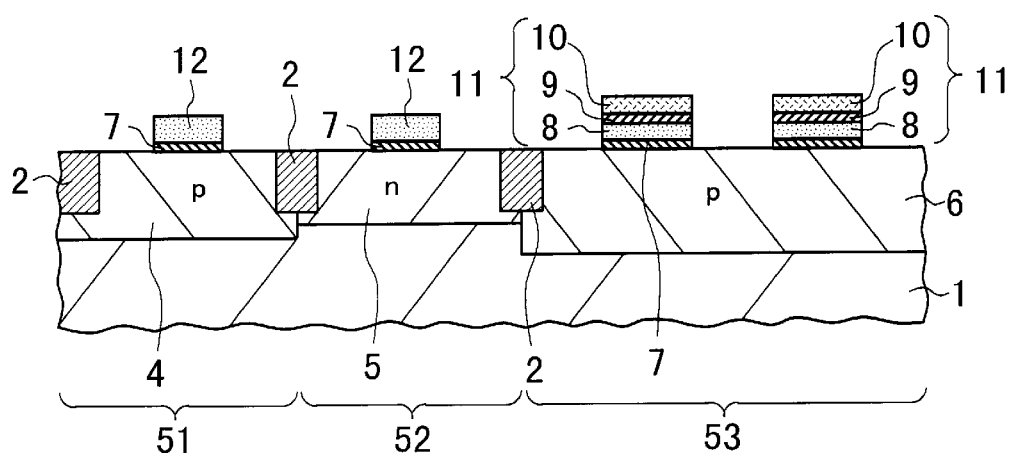

Thereafter, a patterned photoresist film 3b with a pattern covering the areas for gate electrodes is formed using a photolithography technique. Then, using the photoresist film 3b as a mask, the polysilicon film 38, the ONO film 39, and the tungsten polycide film 40 are successively patterned, thereby forming gate electrodes 11 for the n-channel MOS-FETs arranged in the memory cell area 53, as shown in FIG. 2E. The gate electrodes 11 are formed by the combination of the remaining polysilicon film 38, the remaining ONO film 39, and the remaining tungsten polycide film 40. In this patterning process, the $SiO_2$ film 37 is not patterned.

A polysilicon film (not shown) is formed on the whole $SiO_2$ film 37 to cover the whole substrate 1 and then, the polysilicon film is patterned to form gate electrodes 12 for the n- and p-channel MOSFETs in the peripheral NMOS and PMOS regions 51 and 52. In this patterning process, the $SiO_2$ film 37 is not patterned.

The $SiO_2$ film 37 is selectively etched using the gate electrodes 11 and 12 as a mask, thereby forming respective gate oxide films 7 and 8. The state at this stage is shown in FIG. 2E.

The above process steps from FIG. 2A to FIG. 2E are the same as those in the conventional method shown in FIGS. 1A to 1E.

Figure 2F:
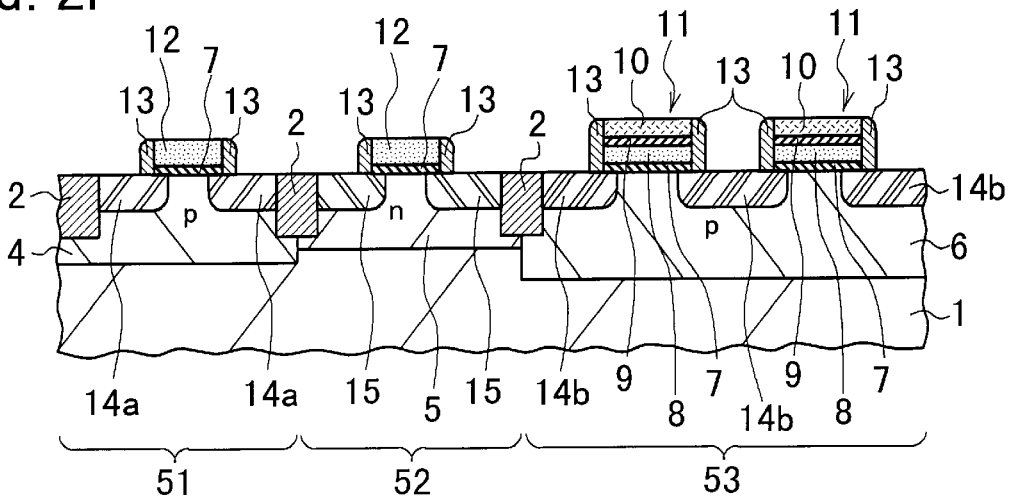

Following this step, a $SiO_2$ film (not shown) is formed on the uncovered main surface of the substrate 1 to cover the gate electrodes 11 and 12 by a CVD process. The $SiO_2$ film is then etched back by an anisotropic etching process, thereby forming sidewall spacers 13 at each side of the gate electrodes 11 and 12, as shown in FIG. 2F.

Arsenic (As) as an n-type impurity is selectively ion-implanted into the p-type well 4 while covering the peripheral PMOS area 52 and the memory cell area 53 by a mask. Thus, the As impurity is selectively implanted into the p-type well 4 in self-alignment to the gate electrode 12, the sidewall spacers 13, and the isolation dielectric 2.

Similarly, arsenic (As) is selectively ion-implanted into the p-type well 6 while covering the peripheral NMOS area 51 and the memory cell area 53 by a mask. Thus, the As impurity is selectively implanted into the p-type well 6 in self-alignment to the gate electrodes 11, the sidewall spacers 13, and the isolation dielectric 2.

In the same way as the p-type wells 4 and 6, boron (B) as a p-type impurity is selectively ion-implanted into the n-type well 5 while covering the peripheral NMOS area 51 and the memory cell area 53 by a mask. Thus, the B impurity is selectively implanted into the n-type well 5 in self-alignment to the gate electrode 12, the sidewall spacers 13, and the isolation dielectric 2.

After an annealing process of the substrate 1 into which As and B have been ion-implanted at a temperature of approximately 900° C., n-type source/drain regions 14a are formed by the As-implanted regions in, the p-type well 4, p-type source/drain regions 15 are formed by the B-implanted regions in the n-type well 5, and n-type source/drain regions 14b are formed by the As-implanted regions in the p-type well 6. The state at this stage is shown in FIG. 2F.

In the above two ion-implantation steps of As, the dose is set as a high value, of approximately $8 \times 10^{15}$ atoms/cm² for the p-type well 6 in the memory cell area 53 while the dose is set as a low value of approximately $1 \times 10^{15}$ atoms/cm² for the p-type well 4 in the peripheral NMOS area 51. This dose setting is due to the following reason.

Figure 4:
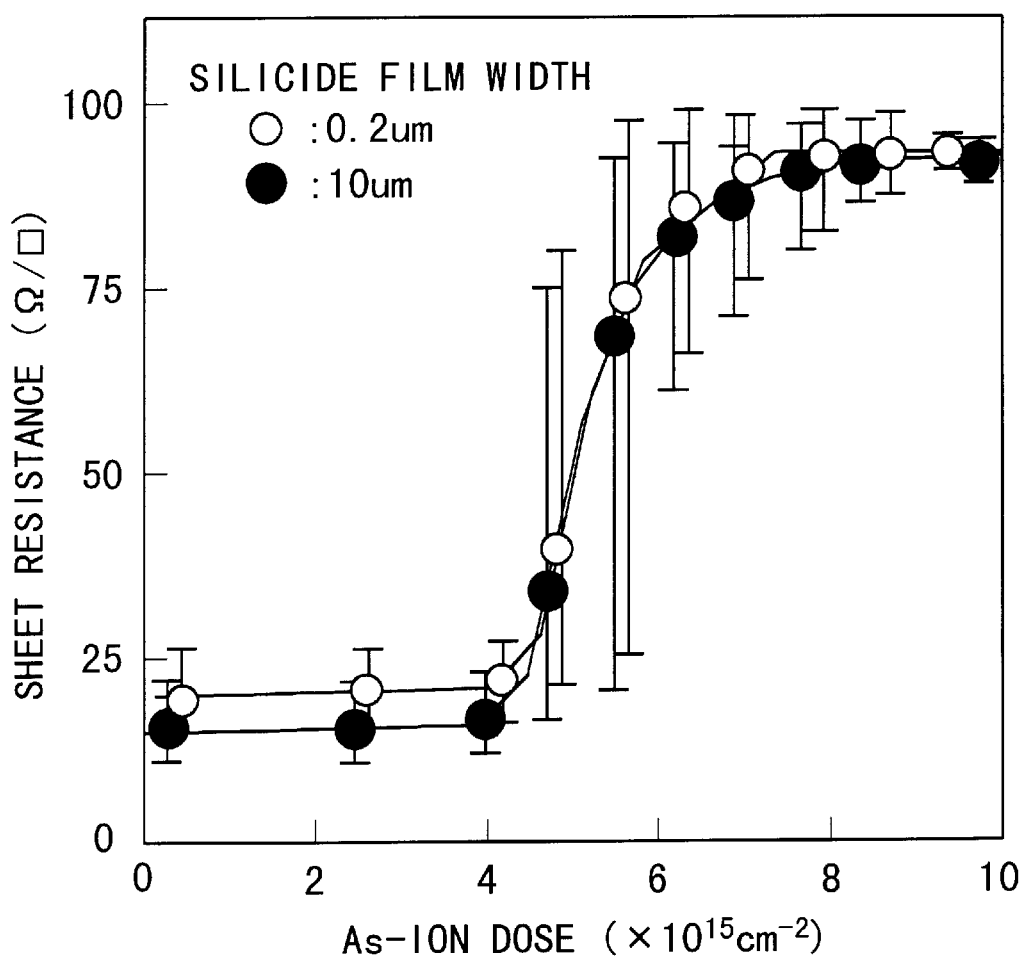
FIG. 4 is a graph showing the relationship between the sheet resistance of the silicide film and the dose of the implanted As ions.

FIG. 4 shows the relationship between the post-silicidation sheet resistance of an As-implanted region of a single-crystal Si substrate and the dose of the implanted As ions, in which the line width of a silicide film is set as 0.2 µm and 10 µm.

It is seen from FIG. 4 that the sheet resistance is as low as 10 Ω/□ when the dose is low and that the sheet resistance drastically increases to approximately 90 Ω/□ when the dose is raised to approximately $5 \times 10^{15}$ atoms/cm². The sheet resistance as high as approximately 90 Ω/□ is approximately equal to that of the As-implanted Si region without any silicide film. It is assumed that this phenomenon is due to the fact that a refractory silicide film becomes difficult to be formed if the dose of As is equal to approximately $5 \times 10^{15}$ atoms/cm² and that substantially no refractory silicide film is formed if the dose of As is equal to approximately $7 \times 10^{15}$ atoms/cm² or higher.

Therefore, it is found that if the dose of As is set as lower than approximately $5 \times 10^{15}$ atoms/cm², a refractory silicide film is formed due to silicidation reaction; however, if the dose of As is set as approximately $5 \times 10^{15}$ atoms/cm² or higher, a refractory silicide film is not or difficult to be formed. In other words, the formation of a refractory silicide film can be controlled by setting the value of the dose of As considering the threshold value of approximately $5 \times 10^{15}$ atoms/cm².

To ensure the formation of a desired refractory silicide film in the p-type well 4 of the peripheral NMOS area 51, it is preferred that the dose for the well 4 is set as a value lower enough than the threshold value of approximately $5 \times 10^{15}$ atoms/cm², for example, approximately $3 \times 10^{15}$ atoms/cm² or lower.

If the dose for the well 6 in the memory cell area 53 is set as approximately $5 \times 10^{15}$ atoms/cm² or higher, the doping concentration of the As-implanted region will be $1 \times 10^{19}$ atoms/cm³ or higher. If the dose for the well 4 in the peripheral NMOS area 51 is set as lower than approximately $5 \times 10^{15}$ atoms/cm², the doping concentration of As of the As-implanted region will be lower than $1 \times 10^{19}$ atoms/cm³.

Figure 2G:
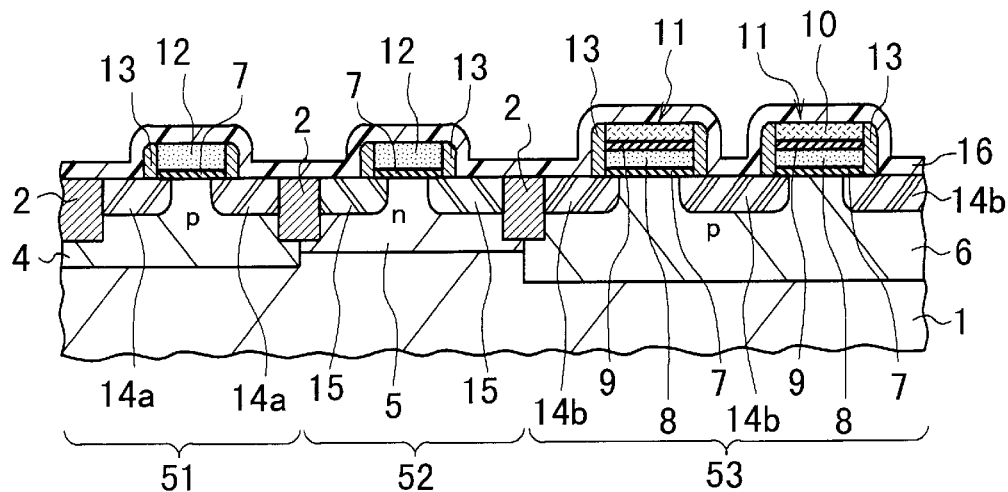

Subsequently, as shown in FIG. 2G, a titanium (Ti) film 16 with a thickness of approximately 20 nm is formed over the whole surface of the substrate 1 by a sputtering process. The substrate 1 with the Ti film 16 is subjected to a heat treatment in a nitrogen ($N_2$) atmosphere with a reduced pressure of 33 mTorr at a temperature of 700° C. for 30 seconds using a lamp annealing apparatus.

Figure 2H:
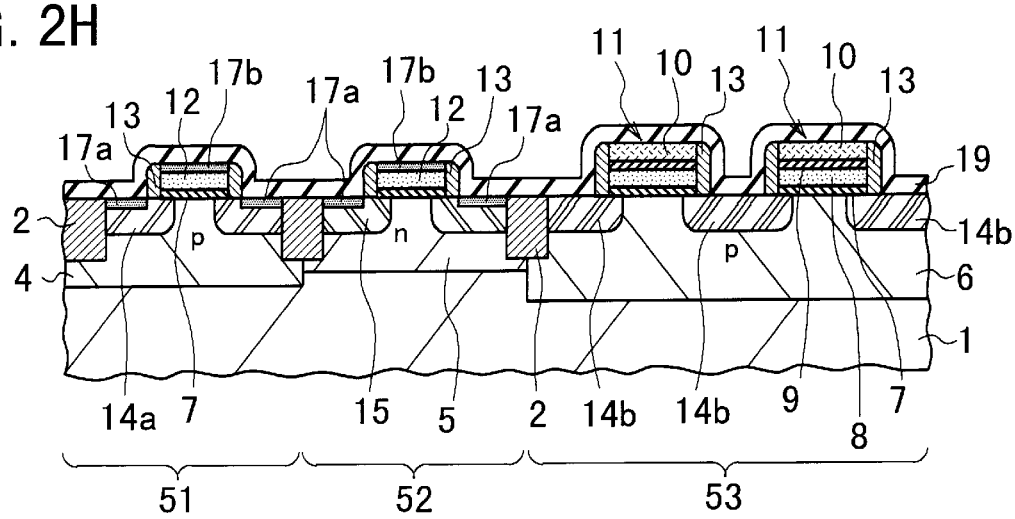

Thus, nitrogen atoms are diffused into the Ti film 16 to thereby form a nitrogen-containing Ti film 19, as shown in FIG. 2H. At the same time as this, the single-crystal Si source/drain regions 14a and 15 and the gate electrodes 12 chemically react with the nitrogen-containing Ti film 19, resulting in titanium silicide ($TiSi_2$) films 17a and 17b due to a silicidation reaction. The $TiSi_2$ films 17a are located at the surfaces of the source/drain regions 14a and 15 in the peripheral NMOS and PMOS areas 51 and 52. The $TiSi_2$ films 17b are located at the surfaces of the gate electrodes 12 in the peripheral NMOS and PMOS areas 51 and 52.

Because of the high dose and high doping concentration of As, silicidation reaction is suppressed at the source/drain regions 14b in the memory cell area 53. Therefore, substantially no $TiSi_2$ film is formed at these source/drain regions 14b.

The $TiSi_2$ files 17a and 17b has the C49 phase with a comparatively high electric resistance.

Since the above annealing process for silicidation is carried out in a $N_2$ atmosphere with a reduced pressure of 33 mTorr, the N diffusion into the Ti film 16, which is induced by a nitrization reaction, is suppressed due to the supply rate decrease of N from the atmosphere. As a result, the diffusion length of N in the Ti film 16 becomes short. This means that the nitrization reaction of the Ti film 16 is suppressed and at the same time, the silicidation reaction of the Ti film 16 with the contact areas of the Si substrate 1 is ensured even if the thickness of the Ti film 16 is reduced according to the device miniaturization.

As seen from this explanation, it is preferred that the above annealing process for silicidation is carried out in a $N_2$ atmosphere with a reduced pressure. A preferred pressure of the $N_2$ atmosphere is 100 mTorr or lower, and a more preferred pressure thereof is 50 mTorr or lower.

Because the Ti film 16 has a thickness as small as 20 nm and the annealing process for silicidation is carried out in a $N_2$ atmosphere, the $TiSi_2$ films thus formed have a desired thickness. At the same time, the Si diffusion into the Ti film 16 is suppressed on the $SiO_2$ sidewall spacers 13 and the $SiO_2$ isolation dielectric 2 and therefore, the overgrowth phenomenon of $TiSi_2$ on the spacers 13 and the dielectric 2 is effectively prevented from occurring.

It has been known that the silicidation reaction is accelerated by the sinking behavior of the nitrogen-containing Ti film 19 into the corresponding regions of the Si substrate 1. During this silicidation process, the nitrogen-containing Ti film 19 is mechanically supported by the surrounding materials such as the sidewall spacers 13 and the isolation dielectric 2. Therefore, if the nitrogen-containing Ti film 19 has a comparatively small width, the sinking behavior of the film 19 is prevented by the surrounding materials and as a result, the silicidation reaction itself is suppressed.

To eliminate or relax the suppression effect to the silicidation reaction, the thickness decrease of the nitrogen-containing Ti film 19 or the Ti film 16 (e.g., approximately 20 nm or less) is effective.

Figure 5:
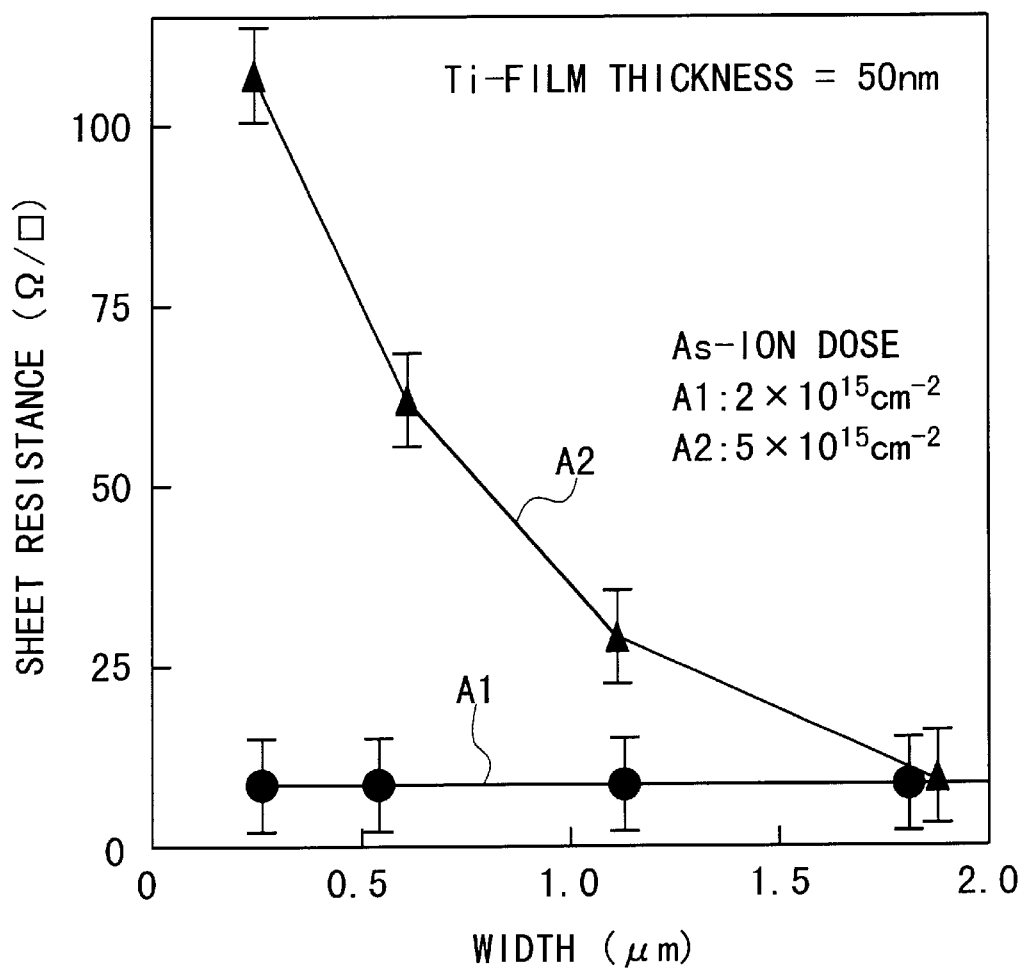
FIG. 5 is a graph showing the relationship between the sheet resistance of the silicide film and the width of the silicide film, in which the Ti film has a thickness of 50 nm.
Figure 6:
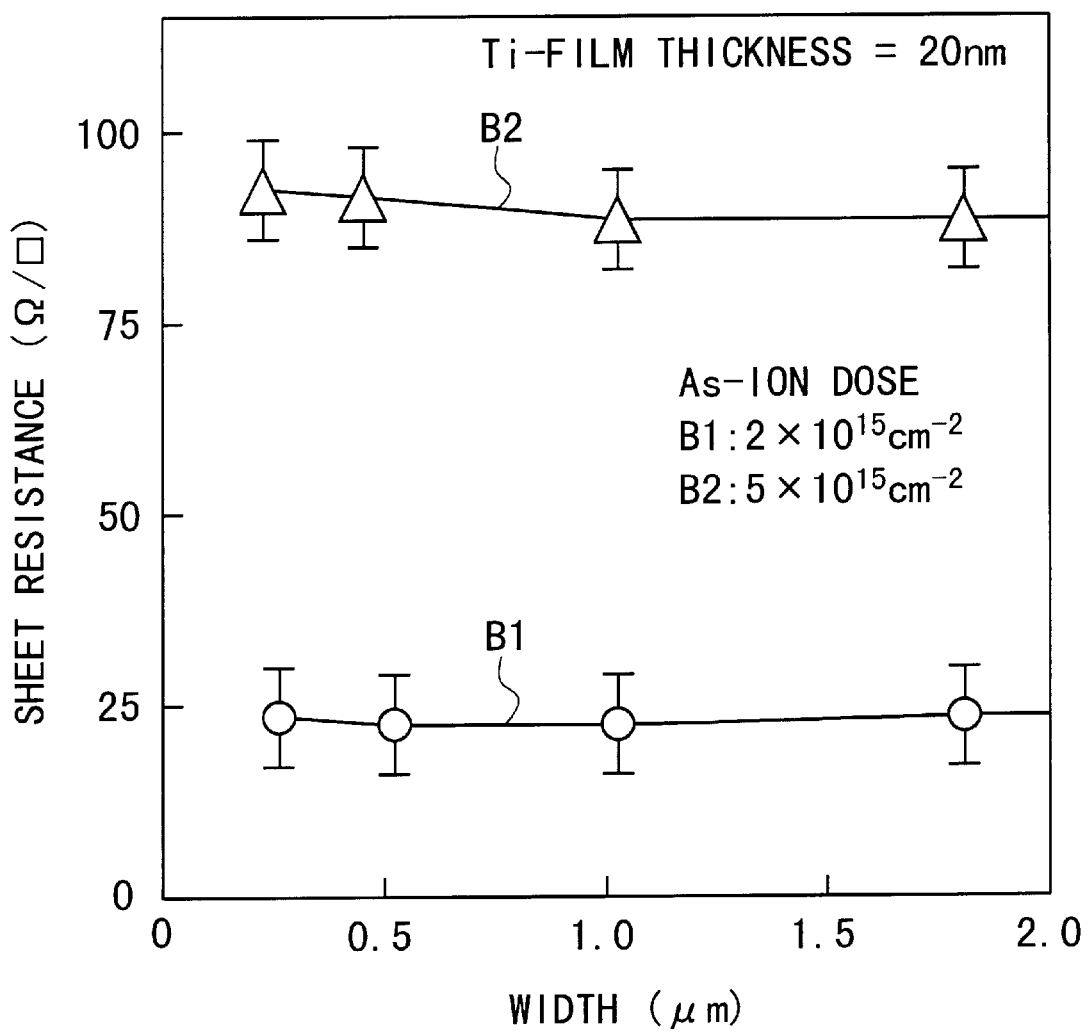
FIG. 6 is a graph showing the relationship between the sheet resistance of the silicide film and the width of the silicide film, in which the Ti film has a thickness of 20 nm.

FIG. 5 shows the relationship between the sheet resistance of a thick $TiSi_2$ film (50 nm in thickness) and the width of the $TiSi_2$ film. FIG. 6 shows the relationship between the sheet resistance of a thin $TiSi_2$ film (20 nm in thickness) and the width of the $TiSi_2$ film.

It is seen from FIG. 5 that the sheet resistance of the thick $TiSi_2$ film (50 nm in thickness) varies dependent upon the width of the $TiSi_2$ film if the dose of As is high. It is seen from FIG. 6 that the sheet resistance of the thin $TiSi_2$ film (20 nm in thickness) is approximately constant independent of the width of the $TiSi_2$ film even if the dose of As is high.

Figure 7:
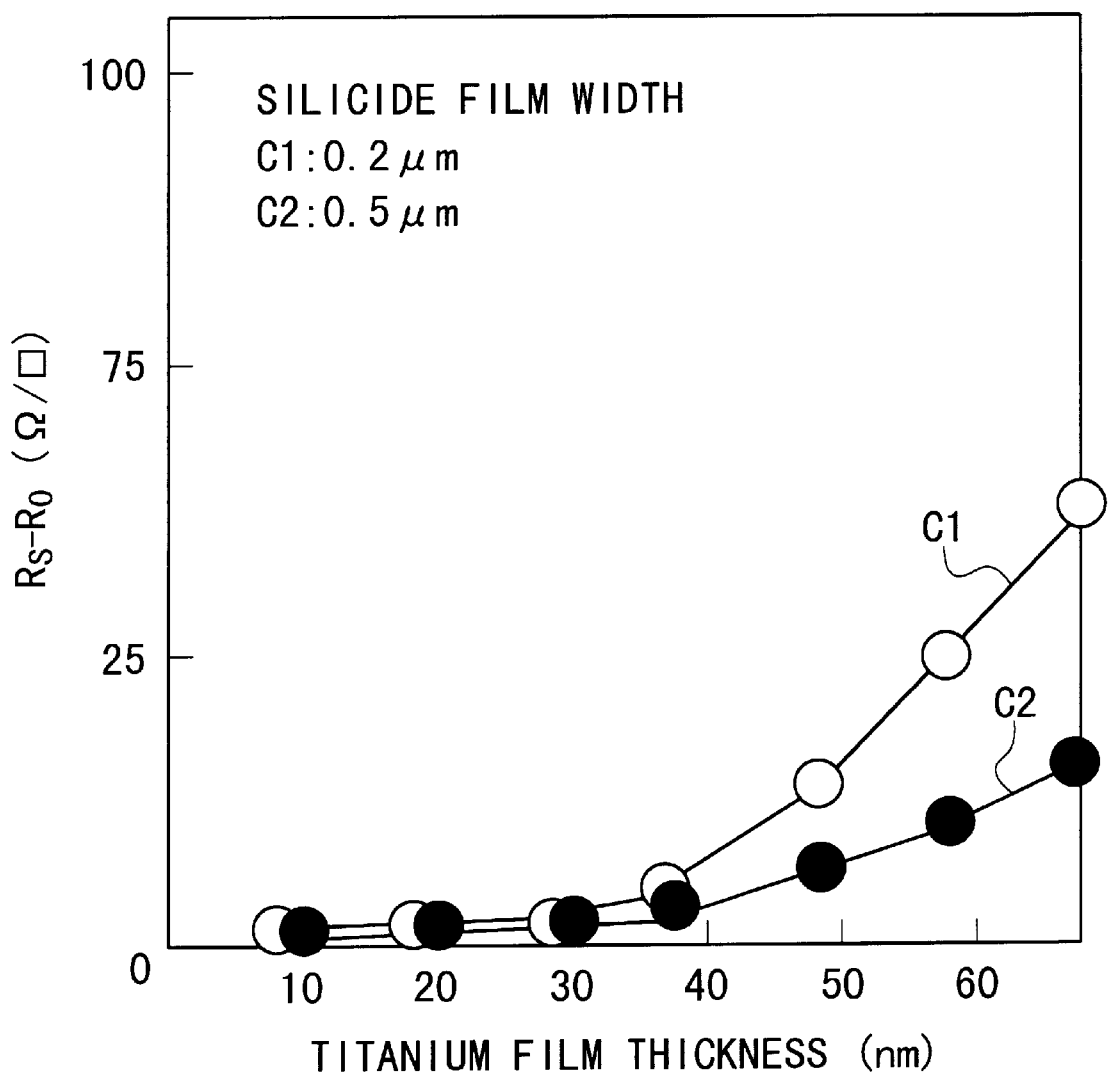
FIG. 7 is a graph showing the relationship between the sheet resistance of the silicide film and the thickness of the Ti film, in which the Ti film has a thickness of 20 nm.

FIG. 7 shows the relationship between the sheet resistance difference ($R_s - R_O$) and thickness of a $TiSi_2$ film, where $R_s$ is the sheet resistance of the $TiSi_2$ film having a width of 0.2 μm or 0.5 μm. and $R_O$ is the sheet resistance of the $TiSi_2$ film having a sufficiently large width such as 1.0 μm or greater.

It is seen from FIG. 7 that the sheet resistance change of the $TiSi_2$ film can be suppressed if the thickness of the $TiSi_2$ film is set as 30 nm or less.

Figure 2I:
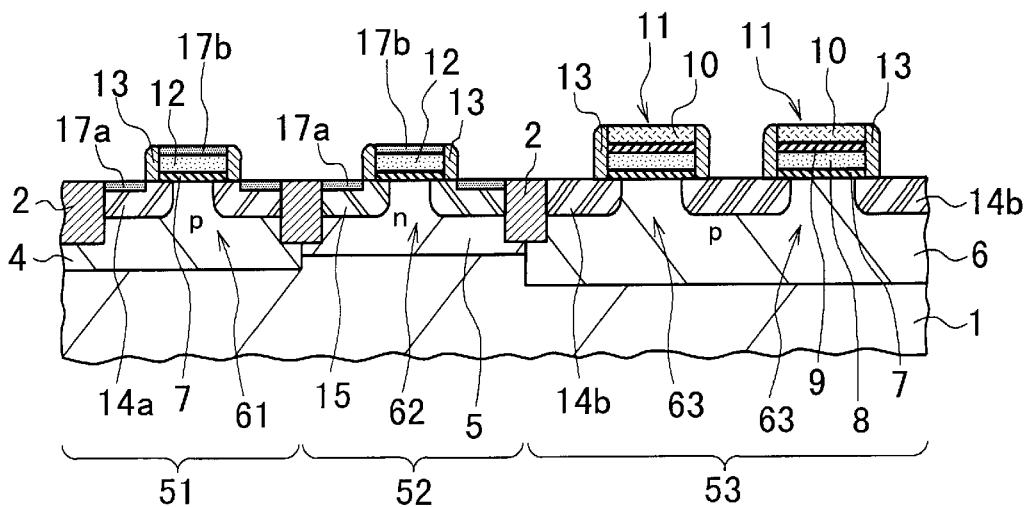

After the above-described heat-treatment or annealing process for silicidation, the unreacted nitrogen-containing Ti film 19 is removed by a wet etching process using a mixture of water solutions of $NH_3$ and $H_2O_2$. Thus, the $TiSi_2$ films 17a and 17b are selectively left on the substrate 1, as shown in FIG. 2I.

The substrate 1 with the $TiSi_2$ films 17a and 17b is then subjected to another heat treatment in an argon (Ar) atmosphere with a normal pressure at a temperature of approximately 800° C. for approximately 10 seconds using a lamp annealing apparatus. Thus, the $TiSi_2$ films 17a and 17b having the C49 phase are turned to have the C54 phase with a comparatively low electric resistance due to phase transition.

Because this heat treatment is carried out in not an $N_2$ atmosphere but an Ar atmosphere, there is an additional advantage that the phase transition temperature is lowered compared with the case of heat treatment in an $N_2$ atmosphere, thereby suppressing the degradation of the performance or characteristics of the MOSFETs due to heat treatment.

Figure 2J:
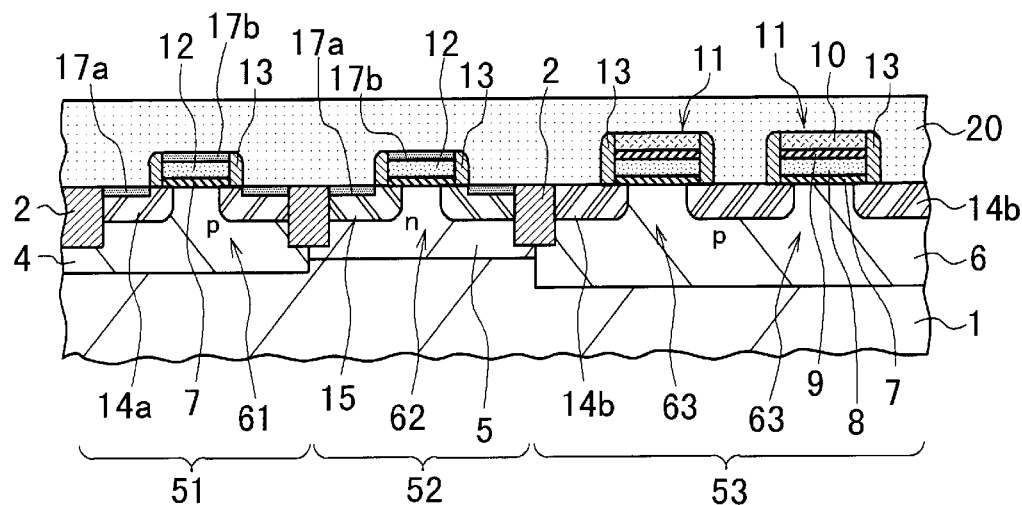

A thick $SiO_2$ film 20 serving as an interlevel dielectric is formed to cover the whole surface of the substrate 1 by a CVD process. Then, the surface of the $SiO_2$ film 20 is planarized by a CMP process, as shown in FIG. 2J.

Figure 2K:
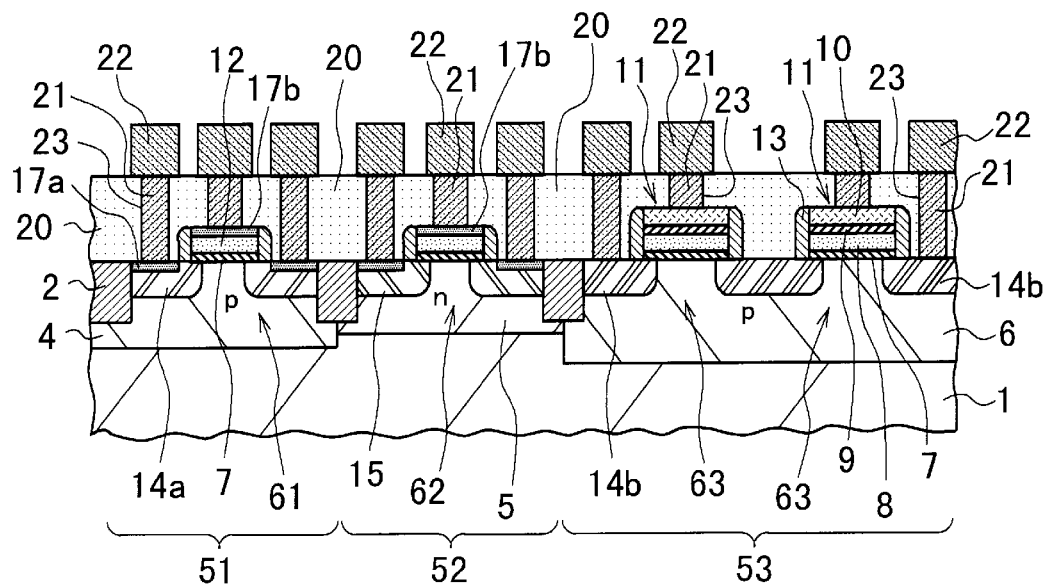

Then, as shown in FIG. 2K, via holes 23 are formed to penetrate through the $SiO_2$ film 20 by using photolithography and etching techniques to the source/drain regions 14a, 14b, and 15 and the gate electrodes 11 and 12. Metallic plugs 21 are filled in the via holes 23 to be contacted with the source/drain regions 14a, 14b, and 15 and the gate electrodes 11 and 12 by a selective growth process of a metal film.

Finally, an Al film (not shown) is formed on the $SiO_2$ film 20 and then, it is patterned to form wiring lines 22 to be contacted with the metallic plugs 21. Thus, the source/drain regions 14a, 14b, and 15 and the gate electrodes 11 and 12 are electrically connected to the wiring lines 22.

Through the above-described process steps, the flush nonvolatile semiconductor memory device according to the first embodiment is completed.

As seen from FIG. 2K, the n-type source/drain regions 14a having the silicide films 17a, the gate oxide film 7, the gate electrode 12 having the silicide film 17b, and the sidewall spacers 13 located in the peripheral NMOS area 51 constitute an n-channel MOSFET 61 of the peripheral circuitry. The p-type source/drain regions 15 having the silicide films 17a, the gate oxide film 7, the gate electrode 12 having the silicide films 17b, and the sidewall spacers 13 located in the peripheral PMOS area 52 constitute a p-channel MOSFET 62 of the peripheral circuitry. The n-type source/drain regions 14b having substantially no silicide films, the gate oxide film 7, the gate electrode 11, and the sidewall spacers 13 located in the memory cell area 53 constitute n-channel MOSFETs 63 of the memory cell array.

With the flush nonvolatile semiconductor memory device according to the first embodiment of the present invention, each of the n-channel MOSFETs 61 in the peripheral circuitry have the source/drain regions 1a whose doping concentration of As is lower than that of the source drain regions 14b of the n-channel MOSFETs 63 in the nonvolatile memory cells. Therefore, to raise the drawing speed of the electrons from the polysilicon floating gates 8 to the source/drain regions 14b of MOSFETs 63 in the nonvolatile memory cells (i.e., the access speed to the memory cells), the doping concentration of the source/drain regions 14b of the MOSFETs 63 can be increased as necessary.

On the other hand, since the doping concentration of the source/drain regions 14a of the MOSFETs 61 in the peripheral circuitry is lower than that of the source/drain regions 14a of the MOSFETs 63 in the memory cells, the electric sheet resistance of the source/drain regions 14a of the MOSFETs is higher than that of the source/drain re ions 14b of the MOSFETs 63. However, the source/drain regions 14a of the MOSFETs 61 in the peripheral circuitry have the silicide films 17a while the source/drain regions 14b of the MOSFETs 63 in the memory cells have substantially no silicide films. Therefore, the sheet resistance of the source/drain regions 14a of the MOSFETs 61 is readily equalized to that of the first MOSFETs 63.

Accordingly, the electric sheet resistance of source/drain regions 14a of the MOSFETs 61 in the peripheral circuitry is able to be decreased to the desired low electric sheet resistance of the source/drain regions 14a of the MOSFETs 63 in the memory cells without degradation of the data writing speed in the memory cells.

This means that both of miniaturization and performance improvement of the semiconductor memory device is able to be realized.

SECOND EMBODIMENT

A flush nonvolatile semiconductor memory device, which is termed a flush EEPROM, according to a second embodiment of the present invention is fabricated in the process steps shown in FIGS. 3A to 3K.

The process steps shown in FIG. 3A to FIG. 3F are the same as those in the second embodiment shown in FIG. 2A to FIG. 2F. Therefore, the explanation about the steps in FIG. 3A to FIG. 3F is omitted here by attaching the same reference numerals to the same elements in FIGS. 3A to 3F for the sake of simplification of description.

Figure 3A:
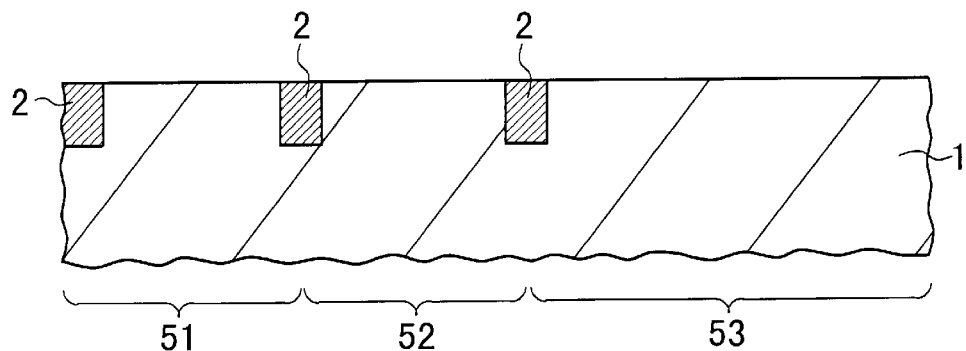
FIGS. 3A to 3K are partial cross-sectional views showing a fabrication method of a flush nonvolatile semiconductor memory device according to a second embodiment of the present invention, respectively.
Figure 3B:
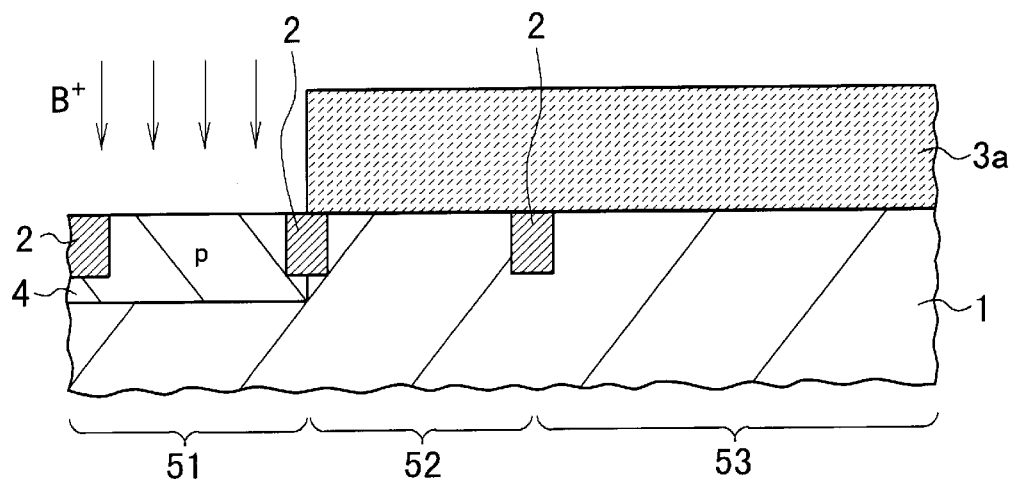
Figure 3C:
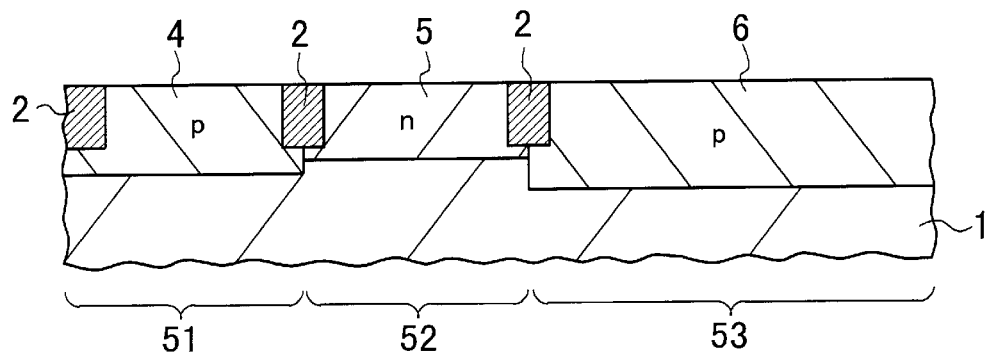
Figure 3D:
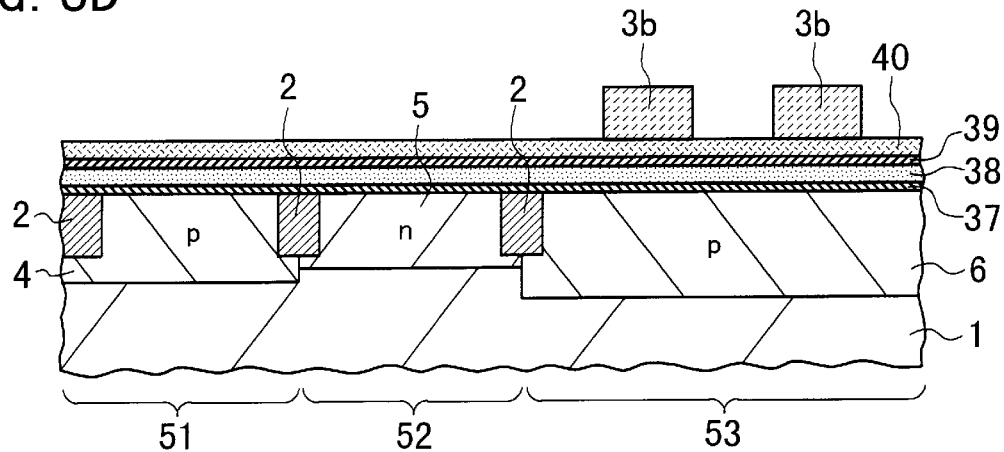
Figure 3E:
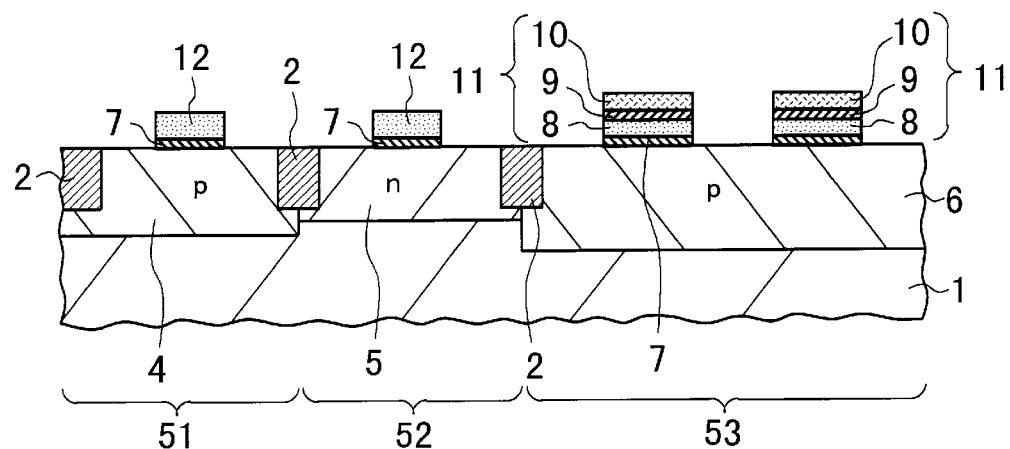
Figure 3F:
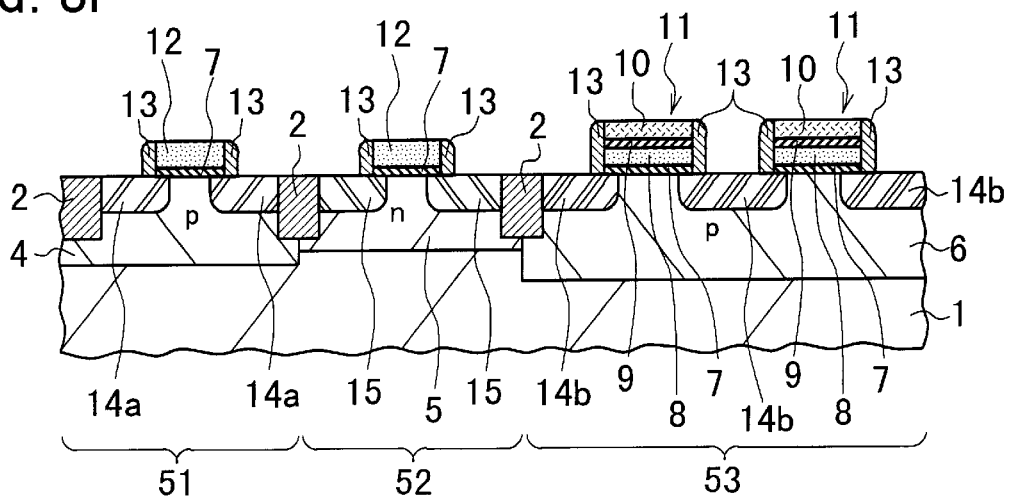
Figure 3G:
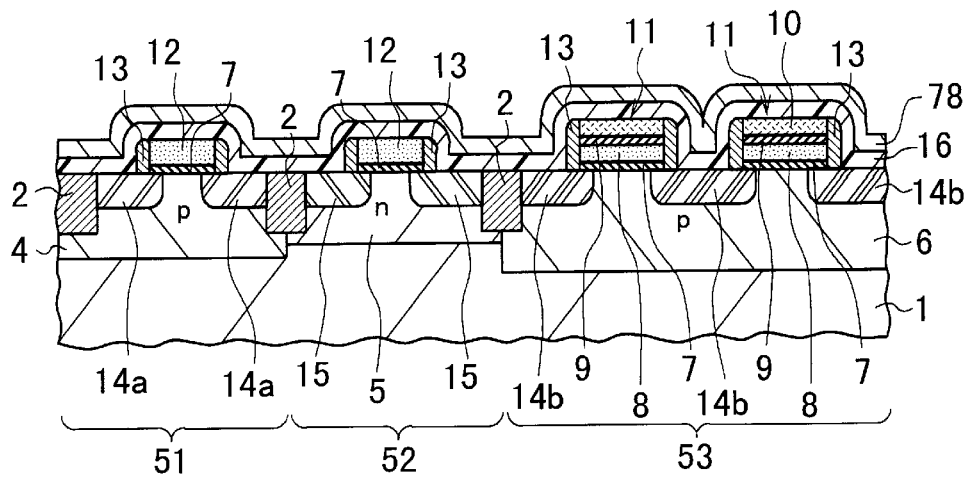

Subsequently, as shown in FIG. 3G, a Ti film 16 with a thickness of approximately 20 nm is formed over the whole surface of the substrate 1 by a sputtering process. The, a titanium nitride (TiN) film 78 with a thickness of approximately 20 nm is formed over the whole surface of the Ti film 16 by a reactive sputtering process.

As seen from this explanation, unlike the first embodiment, the combination of the Ti and TiN films 16 and 78 is used as a refractory metal film in the second embodiment.

Figure 3H:
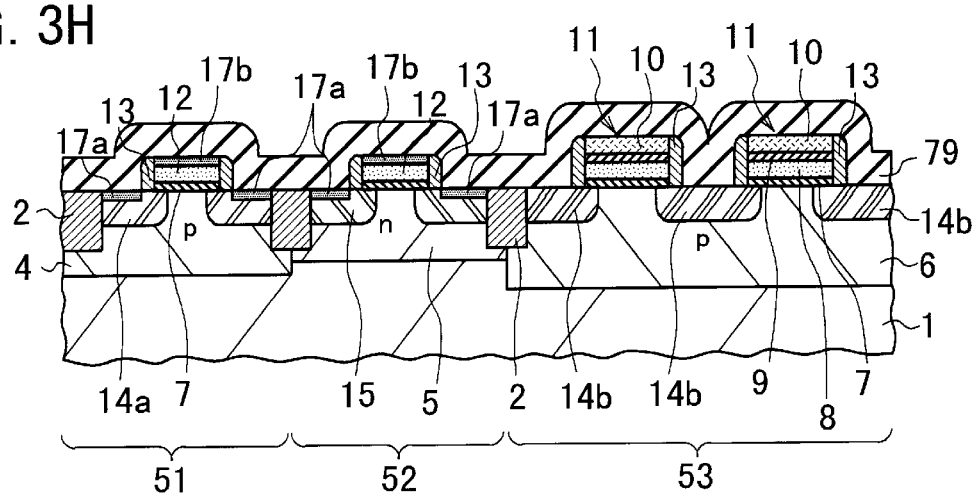

Following this, the substrate 1 with the Ti and TiN films 16 and 78 is subjected to a heat treatment in an Ar atmosphere with a normal pressure at a temperature of 700° C. for 30 seconds using a lamp annealing apparatus. Thus, N atoms existing in the TiN film 78 are diffused into the underlying Ti film 16 to thereby form a nitrogen-containing Ti film 79, as shown in FIG. 3H. At the same time as this, the single-crystal Si source/drain regions 14a and 15 and the polysilicon gate electrodes 12 chemically react with the nitrogen-containing Ti film 79, resulting in TiSi$_2$ films 17a and 17b with the C49 phase due to a silicidation reaction.

The TiSi$_2$ films 17a are located at the surfaces of the source/drain regions 14a and 15 in the peripheral NMOS and PMOS areas 51 and 52. The TiSi$_2$ films 17b are located at the surfaces of the gate electrodes 12 in the peripheral NMOS and PMOS areas 51 and 52.

Because of the high dose and high doping concentration of As, silicidation reaction is suppressed at the source/drain regions 14b in the memory cell area 53. Therefore, substantially no TiSi$_2$ film is formed at these source/drain regions 14b.

Since the above annealing process for silicidation is carried out in an Ar atmosphere, the N diffusion from the TiN film 78 into the Ti film 16 is suppressed due to the diffusion rate decrease of N in the nitrogen-containing Ti film 79. As a result, the nitrization reaction of the Ti film 16 is suppressed and at the same time, the silicidation reaction of the Ti film 16 with the contact areas of the Si substrate 1 is ensured even if the thickness of the Ti film 16 is reduced according to the device miniaturization.

On the SiO$_2$ sidewall spacers 13 and the SiO$_2$ isolation dielectric 2, the nitrogen-containing Ti film 79 has a composition of Ti:N=2:1. This composition is determined by the thickness ratio of the Ti and TiN films 16 and 78 prior to the annealing process for silicidation. When the silicidation reaction is progressing at the interface of the Ti film 16 with the Si substrate 1 and the polysilicon gate electrodes 12, the Ti film 16 is turned to the nitrogen-containing Ti film 79 on the SiO$_2$ sidewall spacers 13 and the SiO$_2$ isolation dielectric 2. Therefore, the Si atoms diffused to the surfaces of the sidewall spacers 13 and the isolation dielectric 2 are prevented from reacting with the Ti atoms in the To film 16. Thus, the overgrowth phenomenon of TiSi$_2$ on the spacers 13 and the dielectric 2 is effectively prevented from occurring.

At the same time, Ti film 16 contacted with the Si substrate 1 and the polysilicon gate electrodes 12 is nitrized. Therefore, the silicidation reaction is suppressed and accordingly, the TiSi$_2$ films 17a and 17b have a desired thickness.

Figure 3I:
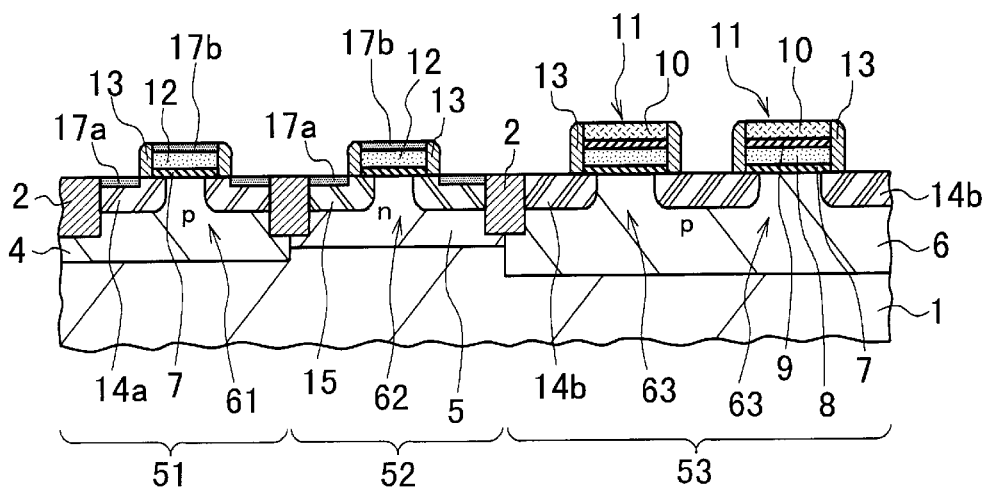

After the above-described heat-treatment or annealing process for silicidation, the unreacted nitrogen-containing Ti film 79 is removed by a wet etching process using a mixture of water solutions of NH$_3$ and H$_2$O$_2$. Thus, the TiSi$_2$ films 17a and 17b are selectively left on the substrate 1, as shown in FIG. 3I.

The substrate 1 with the TiSi$_2$ films 17a and 17b is then subjected to another heat treatment in an argon (Ar) atmosphere with a normal pressure at a temperature of approximately 800° C. for approximately 10 seconds using a lamp annealing apparatus. Thus, the TiSi$_2$ films 17a and 17b having the C49 phase are turned to have the C54 phase with a comparatively low electric resistance due to phase transition.

Figure 3J:
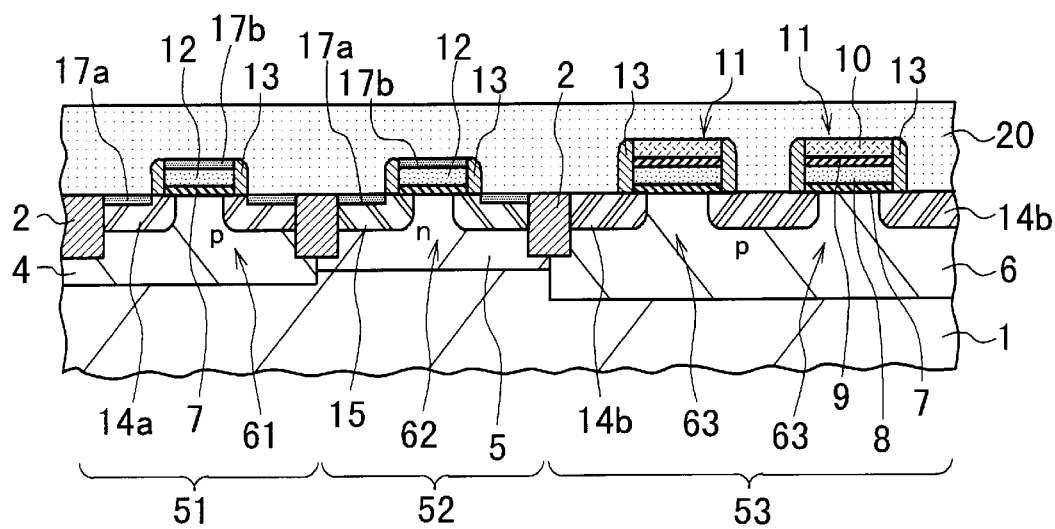
Figure 3K:
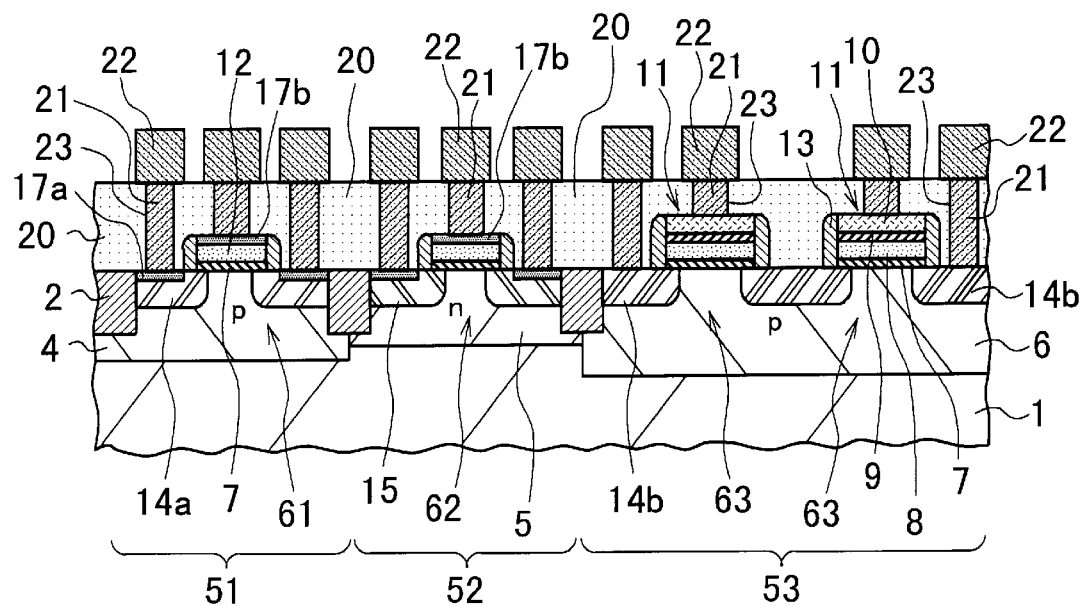

The subsequent process steps shown in FIGS. 3J and 3K are the same as those in the first embodiment shown in FIGS. 2J and 2K. Therefore, the explanation about these steps are omitted here by attaching the same reference numerals to the corresponding elements in FIGS. 3J and 3K.

Through the above-described process steps, the flush nonvolatile semiconductor memory device according to the second embodiment is completed.

As seen from FIG. 3K, the flush nonvolatile semiconductor memory device according to the second embodiment has the same configuration as that of the first embodiment. Therefore, it is obvious that there are the same advantages as those in the first embodiment.

In the above-described first and second embodiments, the heat-treatment processes for the silicidation and C49/C54 phase transition are performed in an Ar atmosphere. However, these processes may be performed in an atmosphere of any other inert gas such as neon (Ne) and helium (He), or in a vacuum atmosphere.

Also, arsenic (As) is used as the n-type impurity for the source/drain regions of the MOSFETs in the above-described first and second embodiments. However, phosphorus (P) may be used instead of As.

While the preferred embodiments of the present invention have been described, it is to be understood that modifications will be apparent to those skilled in the art without departing from the spirit of the invention. The scope of the invention, therefore, is to be determined solely by the following claims.

What is claimed is:

1. A semiconductor device comprising:

(a) nonvolatile memory cells provided on a semiconductor substrate;

said nonvolatile memory cells being formed by a first plurality of MOSFETs of a first conductivity type;

each of said first plurality of MOSFETs being equipped with a gate electrode having a floating gate for data storing and source/drain regions having substantially no silicide films;

(b) a peripheral circuitry provided on said semiconductor substrate;

said peripheral circuitry including a second plurality of MOSFETs of said first conductivity type;

each of said second plurality of MOSFETs being equipped with source/drain regions having silicide films and a doping concentration lower than that of said source/drain regions of each of said first plurality of MOSFETs.

2. The device as claimed in claim 1, wherein each of said second plurality of MOSFETs in said peripheral circuitry has a SALICIDE structure.

3. The device as claimed in claim 1, wherein each of said doping concentration of said source/drain regions of said first plurality of MOSFETs in said memory cells is equal to $1 \times 10^{19}$ atoms/cm$_3$ or higher and said doping concentration of said source/drain regions of said second plurality of MOSFETs in said peripheral circuitry is lower than $1 \times 10^{19}$ atoms/cm$^3$.

4. The device as claimed in claim 1, wherein each of said peripheral circuitry includes a third plurality of MOSFETs of a second conductivity type opposite to said first conductivity type, thereby forming a CMOS structure;

and wherein each of said third plurality of MOSFETs is equipped with source drain regions having silicide films and a doping concentration lower than that of said source/drain regions of each of said first plurality of MOSFETs.

5. The device as claimed in claim 4, wherein each of said third plurality of MOSFETs in said peripheral circuitry has a SALICIDE structure.

6. The device as claimed in claim 4, wherein each of said doping concentration of said source/drain regions of said third plurality of MOSFETS is lower than $1 \times 10^{19}$ atoms/cm$^3$.

* * * * *